(12) United States Patent
Brubaker et al.

(10) Patent No.: US 7,778,063 B2
(45) Date of Patent: Aug. 17, 2010

(54) NON-VOLATILE RESISTANCE SWITCHING MEMORIES AND METHODS OF MAKING SAME

(75) Inventors: Matthew D. Brubaker, Colorado Springs, CO (US); Carlos A. Paz de Araujo, Colorado Springs, CO (US); Jolanta Celinska, Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 407 days.

(21) Appl. No.: 11/937,479

(22) Filed: Nov. 8, 2007

(65) Prior Publication Data

US 2008/0106926 A1 May 8, 2008

Related U.S. Application Data

(60) Provisional application No. 60/858,218, filed on Nov. 8, 2006, provisional application No. 60/904,768, filed on Mar. 2, 2007, provisional application No. 60/906,158, filed on Mar. 9, 2007, provisional application No. 60/913,245, filed on Apr. 20, 2007.

(51) Int. Cl.
G11C 11/00 (2006.01)
(52) U.S. Cl. .................. 365/148; 365/159; 365/163
(58) Field of Classification Search .............. 365/148, 365/159, 163, 100
See application file for complete search history.

(56) References Cited

U.S. PATENT DOCUMENTS

| 6,624,463 | B2 | 9/2003 | Kim et al. |
|---|---|---|---|
| 6,841,833 | B2 | 1/2005 | Hsu et al. |
| 6,903,361 | B2 | 6/2005 | Gilton |
| 7,038,935 | B2 | 5/2006 | Rinerson et al. |
| 7,292,469 | B2 * | 11/2007 | Lee et al. ............... 365/163 |
| 7,639,523 | B2 * | 12/2009 | Celinska et al. ........ 365/148 |
| 2007/0114509 | A1 | 5/2007 | Herner |
| 2008/0106923 | A1 * | 5/2008 | Lung ..................... 365/129 |
| 2008/0107801 | A1 * | 5/2008 | Celinska et al. ........ 427/96.7 |
| 2009/0034355 | A1 * | 2/2009 | Wang ................... 365/230.01 |
| 2009/0140229 | A1 * | 6/2009 | Sandoval ................. 257/3 |

OTHER PUBLICATIONS

Choi et al.; "Resistive Switching Mechanisms of $TiO_2$ Thin Films Grown By Atomic-Layer Deposition"; *Journal of Applied Physics* 98, 033715 (2005).

(Continued)

*Primary Examiner*—Gene N. Auduong
(74) *Attorney, Agent, or Firm*—Patton Boggs LLP

(57) ABSTRACT

An integrated circuit memory cell including: a semiconductor having a first active area, a second active area, and a channel between the active areas; and a layer of a variable resistance material (VRM) directly above the channel. In one embodiment, there is a first conductive layer between the VRM and the channel and a second conductive layer directly above the VRM layer. The VRM preferably is a correlated electron material (CEM). The memory cell comprises a FET, such as a JFET or a MESFET. In another embodiment, there is a layer of an insulating material between the VRM and the channel. In this case, the memory cell may include a MOSFET structure.

9 Claims, 13 Drawing Sheets

OTHER PUBLICATIONS

Inone et al.; "Nonpolar Resistance Switching Of Metal/Binary-Transition-Metal Oxides/Metal Sandwiches: Homogeneous/Inhomogeneous Transition Of Current Distribution"; *arXiv:Cond-mat*/0702564 v.1; Feb. 26, 2007.

Lai, Stephen; "Current Status of the Phase Change Memory and Its Future"; Intel Corporation, Research note RN2-05 (2005).

Park et al.; "Influence Of Oxygen Content On Electrical Properties Of NiO Films Grown By RF Reactive Sputtering"; *J. Vac. Sci. Technol.* B24(5); Sep./Oct. 2006.

Park et al.; "Reproducible Resistive Switching In Nonstoichiometric Nickel Oxide Films Grown by RF Reactive Sputtering For Resistive Random Access Memory Applications"; *J. Vac. Sci. Technol.* A 23(5); Sep./Oct. 2005.

* cited by examiner

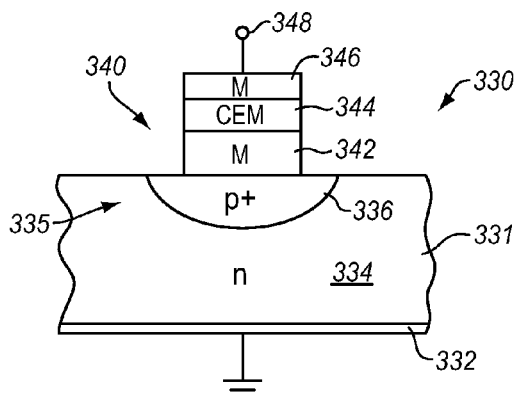
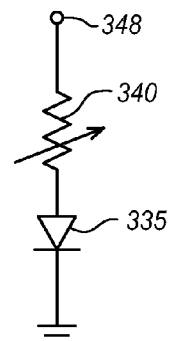
FIG. 3
FIG. 4
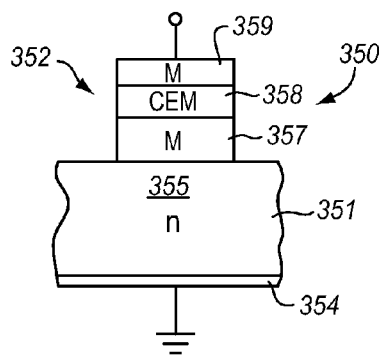
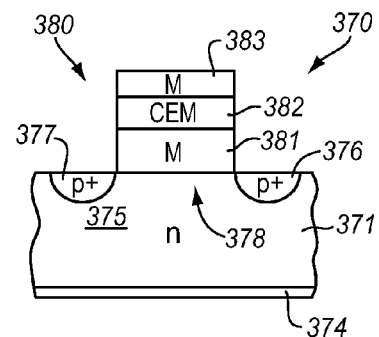
FIG. 5
FIG. 6
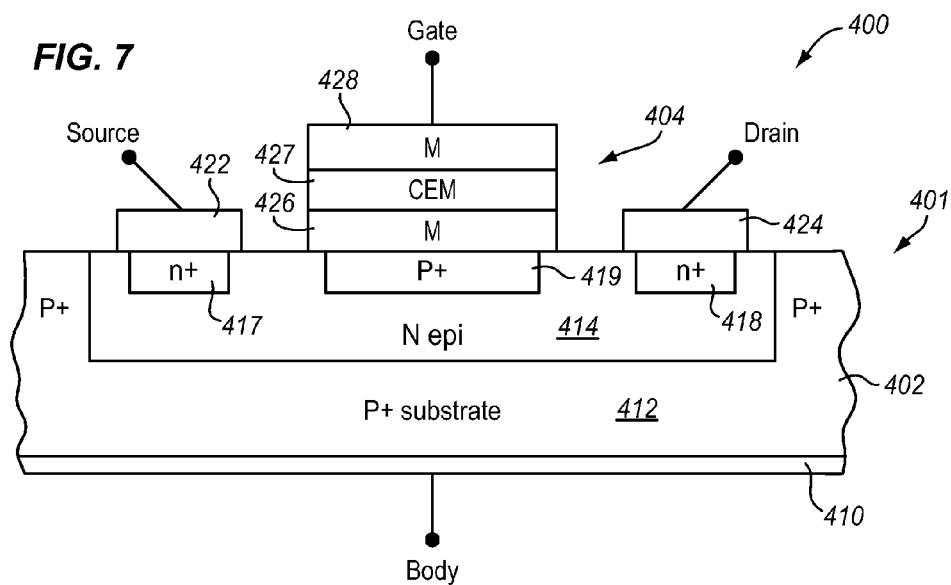
FIG. 7

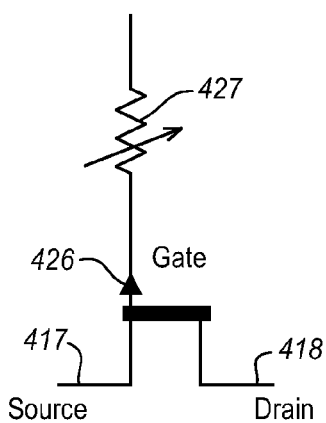
FIG. 8
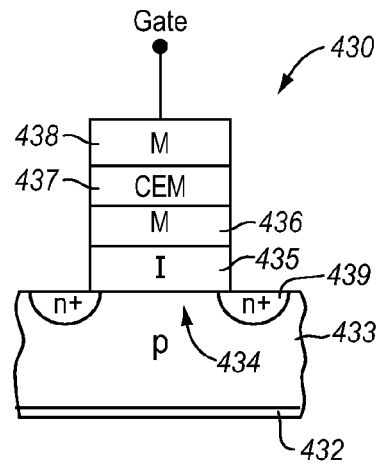
FIG. 9
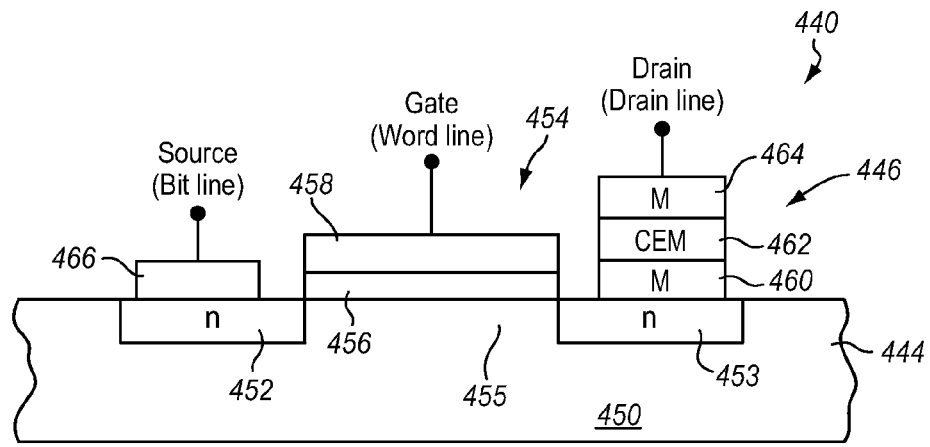
FIG. 10
FIG. 11
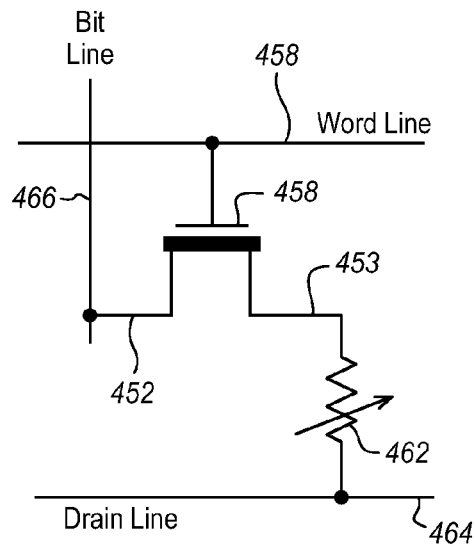
FIG. 12
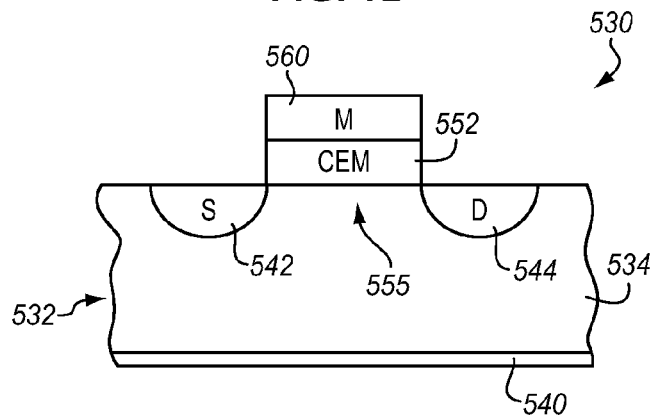

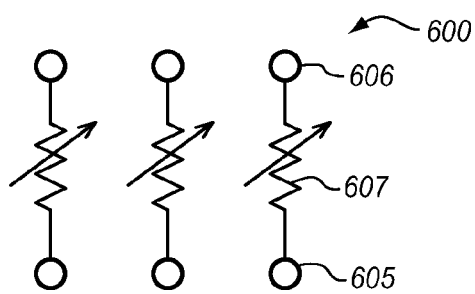
FIG. 13
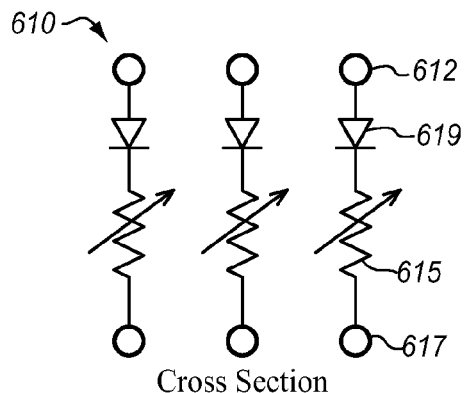
Cross Section
FIG. 14
FIG. 15
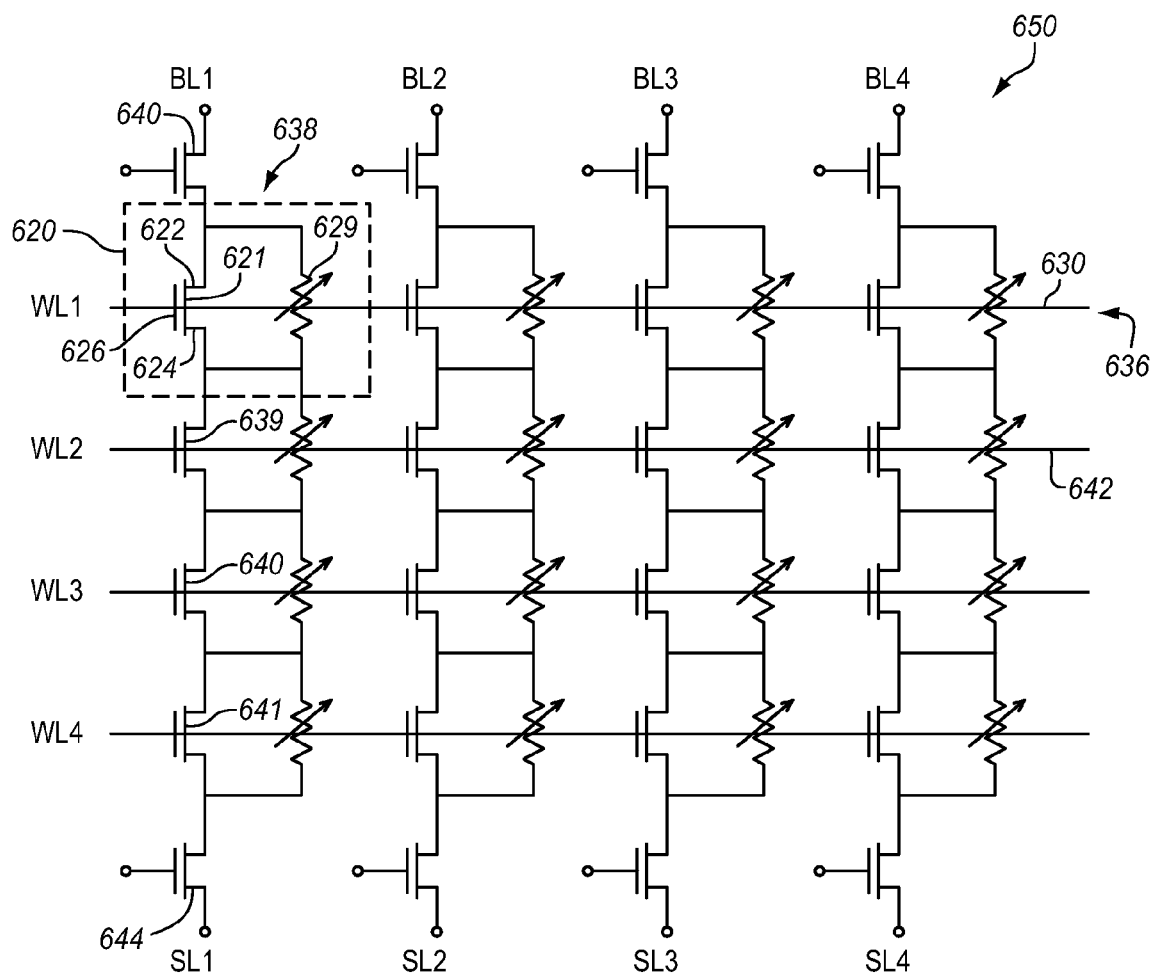

NON-VOLATILE RESISTANCE SWITCHING MEMORIES AND METHODS OF MAKING SAME

CROSS-REFERENCE TO RELATED APPLICATIONS

This application is a Non-Provisional Application claiming the benefit of: Provisional (35 USC 119(e)) Application No. 60/858,218 filed on Nov. 8, 2006; Provisional (35 USC 119 (e)) Application No. 60/904,768 filed on Mar. 2, 2007; Provisional (35 USC 119(e)) Application No. 60/906,158 filed on Mar. 9, 2007; and Provisional (35 USC 119(e)) Application No. 60/913,245 filed on May 21, 2007. All of the foregoing provisional applications are hereby incorporated by reference to the same extent as though fully disclosed herein.

FIELD OF THE INVENTION

The invention in general relates to integrated circuit memories, and in particular, to the formation of non-volatile integrated circuit memories containing materials which exhibit a change in resistance.

BACKGROUND OF THE INVENTION

Non-volatile memories are a class of integrated circuits in which the memory cell or element does not loose its state after the power supplied to the device is turned off. The earliest computer memories, made with rings of ferrite that could be magnetized in two directions, were non-volatile. As semiconductor technology evolved into higher levels of miniaturization, the ferrite devices were abandoned for the more commonly known volatile memories such as DRAMs (Dynamic Random Access Memories) and SRAMs (Static-RAMs).

The need for non-volatile memories never went away. Thus, in the last forty years, many devices were created to fulfill this need. In the late 70's, devices were made with a metallization layer which either connected or disconnected a cell. Thus, at the factory one could set values in a non-volatile way. Once these devices left the factory, they could not be re-written. They were called ROMs (Read Only Memories). In 1967, Khang and SZE at Bell Laboratories proposed devices which were made using field effect transistors (FETs) which had within layers of materials in the gate, the ability to trap charge. In the late 70's and early 80's, devices which could be written by the user and erased by de-trapping the electrons via ultra-violet light (UV) were very successful. The UV both required the device to be removed from the circuit board and placed under a UV lamp for over 15 minutes. These non-volatile memories were called PROMs or programmable ROMs. The writing process involved forcing current from the substrate below to these trap sites. This process of making the electrons pass through layers of materials which have an opposing potential energy barrier is known as quantum tunneling, a phenomenon that only occurs because of the wave-particle duality of the electron. Many types of sandwiches of materials for the gate stack of these FETs were tried, and the technology received many names such as MNOS (Metal-Nitrided-Oxide-Semiconductor), SNOS ([Poly] Silicon-Gate Plus MNOS), SONOS (Silicon-Oxide Plus MNOS) and PS/O/PS/S Polysilicon Control Gate—Silicon Dioxide—Polysilicon Floating Gate—and a thin tunneling oxide on top of the silicon substrate). This kind of erasable and, thus, read/write non-volatile device was known as EEPROMs for electrically-erasable-PROMs, an unfortunate misnomer since they are not just read only. Typically, EEPROMs have large cell areas and require a large voltage (from 12 to 21 volts) on the gate in order to write/erase. Also, the erase or write time is of the order of tens of microseconds. However, the worse limiting factor is the limited number of erase/write cycles to no more than slightly over 600,000—or of the order of $10^5$-$10^6$. The semiconductor industry eliminated the need of a pass-gate switch transistor between EEPROMs and non-volatile transistors by sectorizing the memory array in such a way that "pages" (sub-arrays) could be erased at a time in memories called Flash memories. In Flash memories, the ability to keep random access (erase/write single bits) was sacrificed for speed and higher bit density.

The desire to have low power, high speed, high density, and indestructibility has kept researchers working in non-volatile memory for the last forty years. FeRAMs (Ferroelectric RAMs) provide low power, high write/read speed, and endurance for read/write cycles exceeding 10 billion times. Magnetic memories (MRAMs) provide high write/read speed and endurance, but with a high cost premium and higher power consumption. Neither of these technologies reaches the density of Flash; thus, Flash remains the non-volatile memory of choice. However, it is generally recognized that Flash will not scale easily below 65 nanometers; thus, new non-volatile memories that will scale to smaller sizes are actively being sought.

To this end, there has been much research over the last ten to twenty years on memories based on certain materials that exhibit a resistance change associated with a change of phase of the material. In one type of variable resistance memory, called an RRAM, a change in resistance occurs when the memory element is melted briefly and then cooled to either a conductive crystalline state or a non-conductive amorphous state. Typical materials vary and include GeSbTe, where Sb and Te can be exchanged with other elements of the same properties on the Periodic Table. These materials are often referred to as chalcogenides. See, for example, Stephan Lai, "Current Status of the Phase Change Memory and Its Future", Intel Corporation, Research note RN2-05 (2005); U.S. Pat. No. 7,038,935 issued to Darrell Rinerson et al., May 2, 2006; U.S. Pat. No. 6,903,361 issued to Terry L. Gilton on Jun. 7, 2005; and U.S. Pat. No. 6,841,833 issued to Sheng Teng Hsu et al., Jan. 11, 2005.

Recently, a resistance switching field effect transistor has been disclosed using a Mott-Brinkman-Rice insulator, such as $LaTiO_3$. In this material, according to the theory proposed, the addition of holes via an interface with a $Ba_{(1-x)}Sr_xTiO_3$ layer changes the material from an insulator to a conductor. See U.S. Pat. No. 6,624,463 issued to Hyun-Tak Kim et al., Sep. 23, 2003. This FET uses the Mott-Brinkman-Rice insulator as the channel in the ET. However, no examples of fabrication of actual devices are given.

Another variable resistance memory category includes materials that require an initial high "forming" voltage and current to activate the variable resistance function. These materials include $Pr_xCa_yMn_zO_\epsilon$, with x, y, z, and $\epsilon$ of varying stoichiometry; transition metal oxides, such as CuO, CoO, $VO_x$, NiO, $TiO_2$, $Ta_2O_3$; and some perovskites, such as Cr; $SrTiO_3$. See, for example, "Resistive Switching Mechanisms of $TiO_2$ Thin Films Grown By Atomic-Layer Deposition", B. J. Choi et al., *Journal of Applied Physics* 98, 033715(2005); "Reproducible Resistive Switching In Nonstoichiometric Nickel Oxide Films Grown By RF Reactive Sputtering For Resistive Random Access Memory Applications", Jae-Wan Park, et al., *J. Vac. Sci. Technol. A* 23(5), September/October 2005; "Influence Of Oxygen Content On Electrical Properties Of NiO films grown By RF Reactive Sputtering", Jae-Wan Park, et al., *J. Vac. Sci. Technol. B* 24(5), September/October 2006; "Nonpolar Resistance Switching Of Metal/Binary-Transition-Metal Oxides/Metal Sandwiches: Homogeneous/inhomogeneous Transition of Current Distribution", I. H. Inone et al., *arXiv:Cond-mat/*0702564 v.1 26 Feb. 2007; and U. S. Patent Application Publication No. 2007/0114509 A1, *Memory Cell Comprising Nickel-Cobalt Oxide Switching Element*, on an application of S. Brad Herner. These memories are referred to as ReRAMs, to distinguish them from the chalcogenide type memories.

In summary, there have been literally hundreds, if not thousands, of papers and patent applications written on resistive memories in the last ten years, most of which have been speculative, such as the Herner application cited above. However, a workable resistance switching memory has never been made. Thus, there remains a need in the art for a non-volatile memory that has low power, high speed, high density, and stability and, in particular, such a memory that is scalable to feature sizes well below 65 nanometers.

BRIEF SUMMARY OF THE INVENTION

The invention solves the above and other problems by providing novel architectures for variable resistance materials (VRMs), which include chalcogenides, RRAM materials, correlated electron materials (CEMs), and other materials. The invention also provides unique memory architectures and methods. These memory architectures and methods include a memory in which the memory element comprises a variable resistance material and a diode in series. While this memory element may be read by measuring the resistance, or a voltage or current which depends on the resistance, a method is also provided in which it may be read by measuring its capacitance. The memory architectures also include a variable resistance JFET in which a variable resistance material controls the current flow in and/or the voltage across the JFET channel.

The invention provides an integrated circuit memory having a memory cell including: a semiconductor having a first active area, a second active area, and a channel between the active areas; and a layer of a variable resistance material (VRM) directly above the channel. Preferably, the variable resistance material comprises a correlated electron material (CEM). Preferably, the memory cell further includes a first conductive layer between the VRM and the channel. Preferably, the integrated circuit further includes a second conductive layer directly above the VRM layer. Preferably, the first conductive layer directly contacts the channel. Preferably, the first conductive layer comprises a plurality of conductive layers. Preferably, the memory cell may further include a layer of an insulating material between the VRM and the channel. Preferably, the memory cell comprises a field effect transistor (FET), such as a JFET structure or a MESFET structure, or the memory cell may comprise a MOSFET structure.

In another aspect, the invention provides a resistive switching memory comprising: a plurality of memory cells arranged in rows and columns, each memory cell being a resistive switching memory cell including a resistive switching material, and each of the memory cells comprising a conductor/variable resistance material/conductor (M/VRM/M) stack formed on a channel in a semiconductor; a write circuit for placing selected ones of the resistive switching memory cells in a first memory cell resistive state or a second memory cell resistive state depending on information input into the memory, wherein the resistance of the material is higher in the second resistance state than in the first resistance state; and a read circuit for sensing the state of the memory cell and providing an electrical signal corresponding to the sensed state of the memory cell. Preferably, each of the cells comprises a field effect transistor (FET). Preferably, the FET comprises a JFET. Preferably, the VRM comprises a correlated electron material (CEM).

In a further aspect, the invention provides a method of operating an integrated circuit memory, the method comprising: providing a memory cell including a semiconductor having a first active area, a second active area, and a channel between the active areas; and controlling the conductance of the channel using a variable resistance material. Preferably, the controlling comprises controlling a voltage across the channel or a current in the channel using the variable resistance material. Preferably, the method further comprises reading a voltage across the channel, a current in the channel, or a resistance in the channel.

In yet another aspect, the invention provides a method of writing to a non-volatile memory cell, the memory cell capable of being in a first logic state and a second logic state, the memory cell comprising a variable resistance material (VRM) formed over a semiconductor channel, and the method comprising changing the resistance state of the VRM to determine the logic state of the cell without electron tunneling through an insulating layer.

In still another aspect, the invention provides a method of reading a non-volatile memory cell, the method comprising: measuring the capacitance of the memory cell; and, using said measured capacitance, determining the logic state of the memory cell. Preferably, the memory cell comprises a diode in series with the VRM, and the measuring comprises measuring the capacitance of the diode in series with the VRM.

In still a further aspect, the invention provides a method of making a non-volatile integrated circuit memory, the method comprising: depositing a variable resistance material (VRM) on a semiconductor directly above a channel in the semiconductor; and completing the memory to include the VRM in an active element in the memory. Preferably, the depositing comprises forming a conductor/VRM/conductor stack. Preferably, the forming comprises forming the stack over a JFET channel.

The invention provides integrated circuit architectures which are much better suited to the resistive memory physics, while at the same time providing denser memory arrays and faster program and erase cycles. Numerous other features, objects, and advantages of the invention will become apparent from the following description when read in conjunction with the accompanying drawings.

BRIEF DESCRIPTION OF THE DRAWINGS

FIG. 3 is a cross-sectional view of an M/VRM/M n-p diode switching cell;

FIG. 4 is an equivalent circuit diagram for the M/VRM/M p-n diode switching cell of FIG. 3;

FIG. 5 is a cross-sectional view of an M/VRM/M-metal/semiconductor or Schottky diode switching cell according to the invention;

FIG. 6 is a cross-sectional view of an M/VRM/M-MESFET switching cell according to the invention;

FIG. 7 is a cross-sectional view of an M/VRM/M-JFET switching cell according to the invention;

FIG. 8 is an equivalent circuit diagram of the M/VRM/M-JFET of FIG. 7;

FIG. 9 is a cross-sectional view of an M/VRM/M-MOSFET switching cell according to the invention;

FIG. 10 is a cross-sectional view of a 1 transistor/1 resistor VRM switching cell according to the invention;

FIG. 11 is an equivalent circuit diagram of the 1 transistor/1 resistor VRM switching cell of FIG. 10;

FIG. 12 is a cross-sectional view of an M/VRM-MESFET switching transistor according to the invention in which the VRM forms a Schottky barrier with the semiconductor channel;

FIG. 13 illustrates the cross-sectional equivalent circuit diagram for a VRM memory in a cross-tie architecture;

FIG. 14 illustrates the cross-sectional equivalent circuit diagram for an alternative VRM memory in a cross-tie architecture;

FIG. 15 illustrates a chain cell architecture for a VRM memory according to the invention;

DETAILED DESCRIPTION OF THE INVENTION

Figure 1:
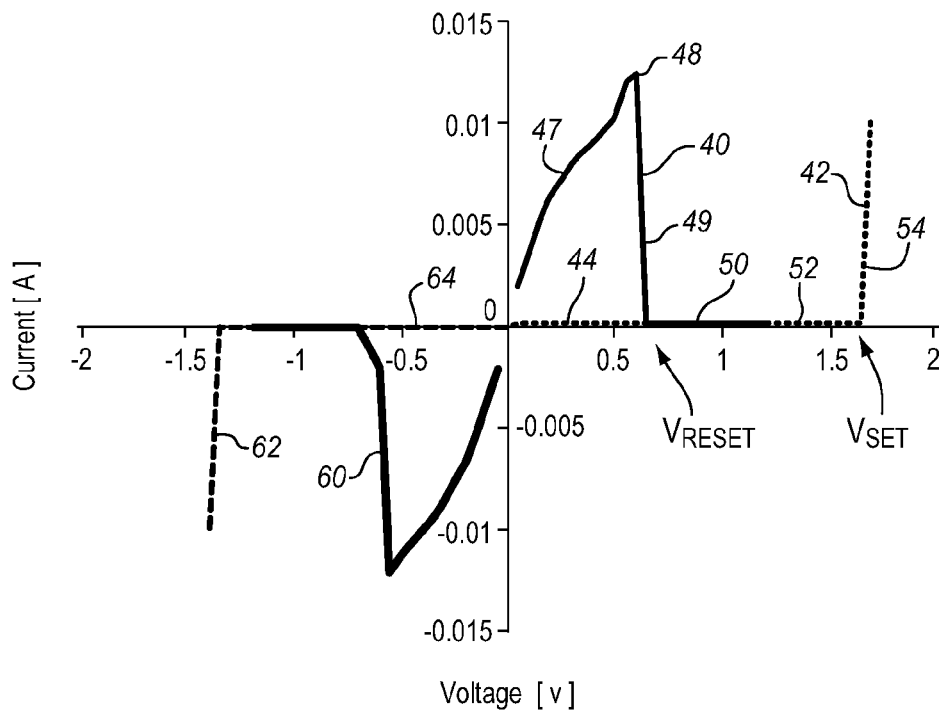
FIG. 1 shows the current in amperes versus bias voltage in volts curves for an NiO resistor according to the invention.

The present disclosure relates to novel memory architectures for variable resistance materials. In this disclosure, a variable resistance material may be referred to as a VRM. In the exemplary discussion required by the patent law, the disclosure focuses on transition metal oxide variable resistance materials, though the invention is applicable to other variable resistance materials as well. Nickel oxide, NiO, is disclosed as the exemplary transition metal oxide. The samples of NiO materials discussed herein are doped with extrinsic ligands which stabilize the variable resistance properties, though this is not a requirement to be a variable resistance material. All of the exemplary NiO variable resistance materials disclosed herein also include at least a carbon ligand, which may indicated by $NiO(C_x)$. This also is not a requirement for a variable resistance material, but is simply exemplary.

The exemplary variable resistance materials discussed herein are Correlated Electron Materials, since these are the most stable variable resistance materials known. A Correlated Electron Material (CEM) is disclosed in detail in co-pending U.S. patent application Ser. No. 11/937,461, which is hereby incorporated by reference to the same extent as though fully disclosed herein. A brief description follows. A CEM is defined as a material that switches from a first resistive state to a second resistive state, with the second resistive state having a resistance at least one hundred times higher than the first resistance state; and the change in resistance is primarily due to a critical density of electrons being reached in a conduction band. Preferably, the CEM material changes from a paramagnetic conductive state to an anti-ferromagnetic insulative state when the Mott transition condition $(n_C)^{1/3}a=0.26$ is reached, where $n_C$ is the concentration of electrons and "a" is the Bohr radius. More preferably, the resistance of the second state is at least two hundred times the resistance of the first state, and most preferably, five hundred times. Generally, these materials include any transition metal oxide, such as perovskites, Mott insulators, charge exchange insulators, and Anderson disorder insulators. Several embodiments representing switching materials are nickel oxide, cobalt oxide, iron oxide, yttrium oxide, and perovskites such as Cr doped strontium titanate, lanthanum titanate, and the manganate family including praesydium calcium manganate and praesydium lanthanum manganate. In general, oxides incorporating elements with incomplete d and f orbital shells exhibit CEM resistive switching properties. Preferably, resistance can be changed by setting at one voltage and resetting at a second voltage. Preferably, the CEM is crystallized in the conducting state, and no electroforming is required to prepare a CEM. The invention contemplates that many other transition metal compounds can be used in the invention. For example, $\{M(chxn)_2Br\}\ Br_2$ where M can be Pt, Pd, or Ni, and chxn is 1R,2R-cyclohexanediamine, and other such metal complexes may be used.

Figure 2:
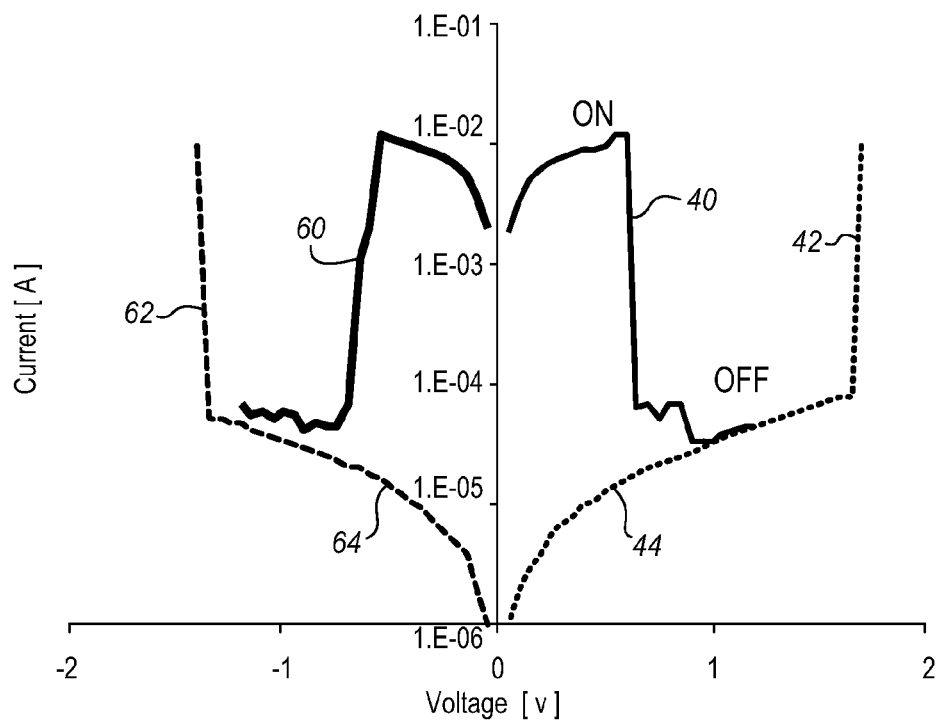
FIG. 2 shows the same curves as shown in FIG. 1 except on a logarithmic scale which shows higher resolution at the smaller values of current.

FIG. 1 shows the current in amperes (amps) versus bias voltage in volts curves for an $NiO(C_x)$ CEM according to the invention. FIG. 2 shows the same curves, except the absolute value of the current is plotted logarithmically to show more detail in the low current values. As has become the nomenclature in the art, the point at which the CEM changes in resistance from a conductor to an insulator is called the RESET point, while the point at which the resistance changes from an insulator to a conductor is called the SET point. Unlike other variable resistance materials, the CEMs are born conductive. We shall refer to this as the ON state, and the insulative state will be called the OFF state. The solid line 40 is the ON state curve for positive voltages, and the solid line 60 is the ON curve for negative voltages. The dotted line 54 is the OFF curve for positive voltages, while the dotted line 62 is the OFF curve for negative voltages. As the voltage is increased, the current rises at 47, until the RESET voltage is reached, which is about 0.65 volts, which is also the point at which critical electron density is reached; then, at point 48, the material suddenly becomes insulative and the current drops sharply along curve 49. The current stays low along the line 52 as the voltage rises until the SET voltage is reached at about 1.65 volts, which, in a voltage to temperature conversion, corresponds to the Neel temperature for these materials, at which point the material again becomes conductive and the current rises along line 54. If the voltage is returned to zero and then raised again when the CEM is in the insulative state, the current follows the line 44; while the voltage is returned to zero after the material becomes conducting, that is after the $V_{SET}$ point, the current follows the line 47. It is evident from FIGS. 1 and 2 that the write memory window exists between $V_{reset}$ and $V_{set}$, while the read memory window exists between the ON and OFF state current level. It is also evident from FIGS. 1 and 2 that these memory windows are easily large enough for a viable commercial memory. Thus, it can be seen that a CEM is a preferable VRM, though the architectures disclosed herein can be used with any variable resistance switching material.

FIGS. 3-17 illustrate the non-volatile memories according to the invention. In this context, the word "substrate" can mean the underlying semiconductor material 331, 351, etc. on which the integrated circuit is formed, as well as any object, such as layer 342 in FIG. 3, on which a thin film layer, such as 344, is deposited. In this disclosure, "substrate" shall generally mean the object to which the layer of interest is applied.

The long horizontal dimensions of substrates 331, 351, etc. define planes that are considered to be a "horizontal" plane herein, and directions perpendicular to this plane are considered to be "vertical". The terms "lateral" or "laterally" refer to the direction of the flat plane of the semiconductor substrate, that is, parallel to the horizontal direction. Terms of orientation herein, such as "above", "top", "upper", "below", "bottom", and "lower" mean relative to substrate 331, 351, etc. That is, if a second element is "above" a first element, it means it is farther from semiconductor substrate 331, 351 etc.; and if it is "below" another element, then it is closer to semiconductor substrate 331, 351, etc. than the other element. Terms such as "above", "below", or "on" do not, by themselves, signify direct contact. However, terms such as "directly on" or "onto" do signify direct contact of one layer with an underlying layer. However, "directly above" does not require direct contact, but rather means that a second element that is "directly above" a first element means that, if a line is drawn perpendicular to the underlying substrate and the line passes through the first element, it also will pass through the second element. It is understood that thin films of VRM fabricated in accordance with the invention have various shapes and conform to various topographies and features of an integrated circuit substrate. Accordingly, thin films of VRM in accordance with the invention are formed on planar substrates, in trenches and vias, on vertical sidewalls, and in other various non-horizontal and three-dimensional shapes.

The term "thin film" is used herein as it is used in the integrated circuit art. Generally, it means a film of less than a micron in thickness. The thin films disclosed herein are typically less than 500 nanometers (nm) in thickness. A thin film of correlated electron material fabricated by a method in accordance with the invention typically has a final thickness in a range of about from 20 nm to 300 nm, preferably in a range of about from 25 nm to 150 nm. The thin films having a thickness of about 60 nm or less are specifically designated "ultra-thin films" in this specification. These thin films and ultra-thin films of the integrated circuit art should not be confused with the layered capacitors of the macroscopic capacitor art which are formed by a wholly different process that is incompatible with the integrated circuit art.

FIG. 3 is a cross-sectional view of an M/VRM/M n-p diode switching cell 330. FIG. 4 is an equivalent circuit diagram for the M/VRM/M p-n diode switching cell of FIG. 3. Cell 330 is formed on a semiconductor wafer, which is preferably silicon, but also may be gallium arsenide, germanium, silicon-on-insulator (SOI), or any other suitable semiconducting substrate. Wafer 331 preferably includes an isolation layer 332, an n-type region 334, a p+ active area 336, and a metal/VRM/Metal variable resistance device 340 formed on active area 336. N-type region 334 and p+ active area 336 form an n-p junction diode 335. Device 340 includes a bottom electrode 342, a VRM layer 344, and a top electrode 348. VRM device 340 is preferably part of a cross-tie structure.

FIG. 5 is a cross-sectional view of an M/VRM/M-metal/semiconductor or Schottky diode switching cell 350 according to the invention. Cell 350 comprises a Metal/VRM/Metal switching element 352 fabricated on a semiconductor wafer 351. Wafer 351 includes isolation layer 354 and n-type doped area 355. Variable resistance switching element 352 comprises a lower electrode 357, a VRM layer 355, and a top electrode 359. The Schottky diode is formed at the interface of the n-type area 355 and electrode 357. Variable resistance device 352 is preferably part of a cross-tie structure.

FIG. 6 is a cross-sectional view of an M/VRM/M-MESFET 370 according to the invention. Cell 370 is essentially an MESFET in which VRM switching element 380 is the gate of the MESFET 370. Cell 370 comprises a Metal/VRM/Metal switching element 380 fabricated on a semiconductor wafer 371, which is preferably gallium arsenide, but may also be germanium, silicon, or any other suitable semiconductor. Wafer 371 includes isolation layer 374, n-type doped area 375 including channel 378, and p+ type active areas 376 and 377. Variable resistance switching element 380 comprises a lower electrode 381, a VRM layer 382, and a top electrode 383. Variable resistance switching device 380 is preferably part of a cross-tie structure.

FIG. 7 is a cross-sectional view of an M/VRM/M-JFET memory switching cell 400 according to the invention, and FIG. 8 is an equivalent circuit diagram of the M/VRM/M-JFET 400 of FIG. 7. This structure is essentially a JFET in which a variable resistance switching element 404 forms one side of the JFET gate. M/VRM/M-JFET 400 is formed on semiconductor wafer 401 comprising a backside gate contact layer 410, a p+ substrate 412, and n-type region 414, which is preferably an epitaxial layer. N+ active areas 417 and 418 and p+ region 419 are formed in n-type region 414. Metallization contacts 422 and 424 are formed on active regions 417 and 518, respectively. Metal layer 426, VRM 427, and metal layer 425 are formed over p+ region 419.

FIG. 9 is a cross-sectional view of an M/VRM/M-MNOSFET memory switching cell 430 according to the invention. Device 430 comprises a p-type semiconductor 433 on an isolation layer 432, n+ active areas 439, and gate stack 434. Gate stack 434 includes insulator 435, which is preferably silicon dioxide, conductive gate 436, VRM layer 437, and top electrode 438.

FIG. 10 is a cross-sectional view of a 1 transistor/1 resistor VRM switching cell 440 according to the invention, and FIG. 11 is an equivalent circuit diagram of the 1 transistor/1 resistor VRM switching cell of FIG. 10. Cell 440 is formed on semiconductor wafer 444, which is preferably p-type silicon, but may be any other semiconductor. N-type active areas 452 and 453 are formed in wafer 444, and gate insulator 456 and gate 458 are formed over channel region 455 between the active areas as in conventional CMOS structures. A VRM device 446 is formed on one active area 453, and a metallization contact layer 466 is formed on the other active area 452. VRM device 446 comprises bottom electrode 460, VRM layer 462, and top electrode 464. While this structure is similar to 1T/1C DRAM and ferroelectric memory structures, VRM layer 462 does not store charge, but rather switches resistance states. The resistance state can be identified by the voltage drop across the VRM device 446.

FIG. 12 is a cross-sectional view of an M/VRM/S MESFET switching transistor 530 according to the invention in which the VRM forms a Schottky barrier with the semiconductor channel. M/VRM/S switch 530 is formed on a semiconductor wafer 532, which is preferably silicon but may be any other suitable semiconductor. An isolation layer 540 is formed at the bottom of the wafer, and either a p-type or n-type region 534 forms the channel region 555, on either side of which are implants 542 and 544 which form active regions. A VRM layer 552 is formed on channel 555, and a metal layer 560 is then formed on VRM layer 552.

A basic VRM cross-tie array is shown in FIG. 13. FIG. 13 illustrates the cross-sectional equivalent circuit diagram for a VRM memory in a cross-tie architecture. In the cross-tie architecture, first conducting lines 606 running in a first direction form a cross-tie with second conducting lines 605 running in a second direction, which second direction is preferably perpendicular to the first direction. At each point where the lines cross, a memory cell, is formed. In the simplest cross-tie memory shown in FIG. 13, a VRM layer, such as 607, is sandwiched between the conductors 605 and 606. This memory is preferably operated by setting all cells to the conducting state, then writing selected cells to the insulating state. For example, if the reset voltage is 1 volt, VRM element 607 may be reset to an insulating state by placing ½ volt on line 606 and ½ volt on line 607. The other lines are held at zero volts. The non-selected VRM elements, such as 607, will not be reset because the voltage placed on them will always be less than the reset voltage. Individual cells may be read by placing a small read voltage across the lines corresponding to that cell and holding all other lines in the open state. If the selected cell is conducting, there will be much less of a voltage drop across it than if it is insulating. The state of the cell thus can be read by sense amplifiers known in the art. While this simple cell structure requires a block erase, other cross-tie cell architectures using a VRM that are true random access memories for both write and read will be discussed below.

FIG. 14 illustrates another cross-tie memory 610 according to the invention having a VRM layer 615 between cross-tie electrodes 612 and 617. This is the same as the memory 600 of FIG. 23 except that a Schottky diode 619 is formed at the intersection of VRM layer 615 and top electrode 612.

FIG. 15 illustrates a chain cell VRM memory array 650 according to the principles of the present invention. The memory array 650 is composed of memory cells, such as 620, that include a VRM memory element 629 connected in parallel with a switch 621. In one embodiment, the switch 621 may be a MOS transistor. Alternatively, other types of transistors may be utilized. The memory array 650 may be configured by forming series or chains 638 of memory cells 620. As shown, the chains of memory cells 620 may be connected along bit lines BL1-BL4. Word lines WL1-WL4, such as 630, may be connected to memory cells via gate terminals, such as 626, of the switches along a row 636 of memory cells 620. Each bit line may have a select switch, such as 640, and sense switch, such as 644, connected thereto used to control access to memory cells 620 along the corresponding bit lines BL1-BL4. For example, to access a memory cell 620 having switch 621, select switch 640 and control switch 644 are selectably turned on. Below each control switch, such as 644, may be a sense amplifier SL1-SL4 that is used for reading data stored in the memory cells along the corresponding bit line as understood in the art.

Figure 16:
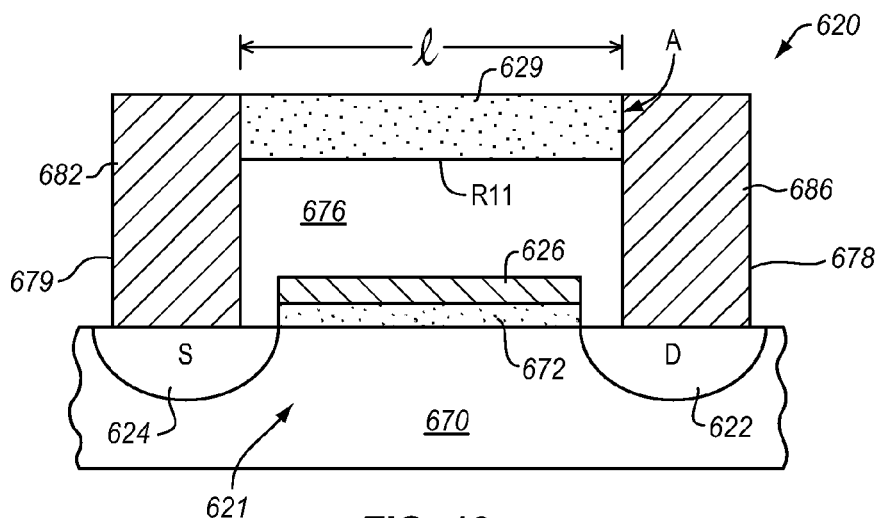
FIG. 16 illustrates a cross-sectional view showing the structure of one embodiment of a memory cell of the memory of FIG. 25.

FIG. 16 is a cross-sectional view showing the preferred physical structure of a memory cell 620 in the chain cell memory array 650 of FIG. 15. This physical structure may also be used for other memories having memory cells including a transistor and a resistor. Memory cell 620 includes transistor 621 and variable resistance resistor 629. Transistor 629 comprises semiconductor 670, preferably silicon, having doped source active region 624 and doped drain active region 622, silicon oxide layer 672 and gate 626, preferably polysilicon. An interlayer dielectric 676 covers transistor 621. Vias 778 and 779 are formed in interlayer oxide 676 and filled with metallization to form posts 682 and 686, which serve as electrodes. A thin VRM layer 629 is deposited to connect posts 682 and 686. As known in the art, the resistance R of element 629 is $R = \rho l/A$, where $\rho$ is the resistivity, l is the length of the VRM element as shown in FIG. 16, and A is the area of the VRM element perpendicular to the current flow. As shown in FIG. 16, A is very small, equal to the thickness of layer 629 times its width into the paper. Since the thickness can be extremely small and controlled quite precisely, the resistance in this structure easily can be made large and controlled. The structure of FIG. 16 also makes it easy to link together the chain cells of FIG. 15, with the drain of one transistor 621 sharing the same doped region as the source of the next transistor 639, and the posts 682 and 686 serving double duty as the posts for the neighboring cells as well. Preferably, element 629 is a CEM, but may be any material with a variable resistance.

As previously described, the switches, such as 640 and 644 at the top and bottom, respectively, of the bit lines BL1-BL4 are row/column select switches and sense switches, respectively. The select switches 640 and sense switches 644 are used to select a certain bit and to separate the memory array 650 from external circuitry. For example, if memory cell 620 is to be selected, select switch 640 and sense switch 644 are turned on and the other select and sense switches are turned off. In addition, word line 630 is grounded, i.e., signal WL1 is made zero, and each of the other word line signals WL2, WL3, and WL4 are turned high. By applying a low voltage onto word line WL1, switch 621 remains off or is turned off so that current is forced through element 629 connected in parallel to switch 621. Because word line signals WL2, WL3, and WL4 are high, each of the corresponding switches 639, 640, and 641 are turned on such that current flows through the switches and bypasses each of the other resistive elements, respectively, connected in parallel. The process of being able to select one memory cell along a bit line enables random access writing and reading. While not writing to or reading from the memory array 650, select switches, such as 640, and sense switches, such as 644, may be turned off so that memory array 650 is isolated from the external circuitry, thereby keeping electrical noise from memory array 650. It should be understood that memory array 650 is shown as a 4×4 chain array simply as an example that can fit on a drawing, and may be sized and dimensioned as desired, such as 128×128 and much larger.

Figure 17:
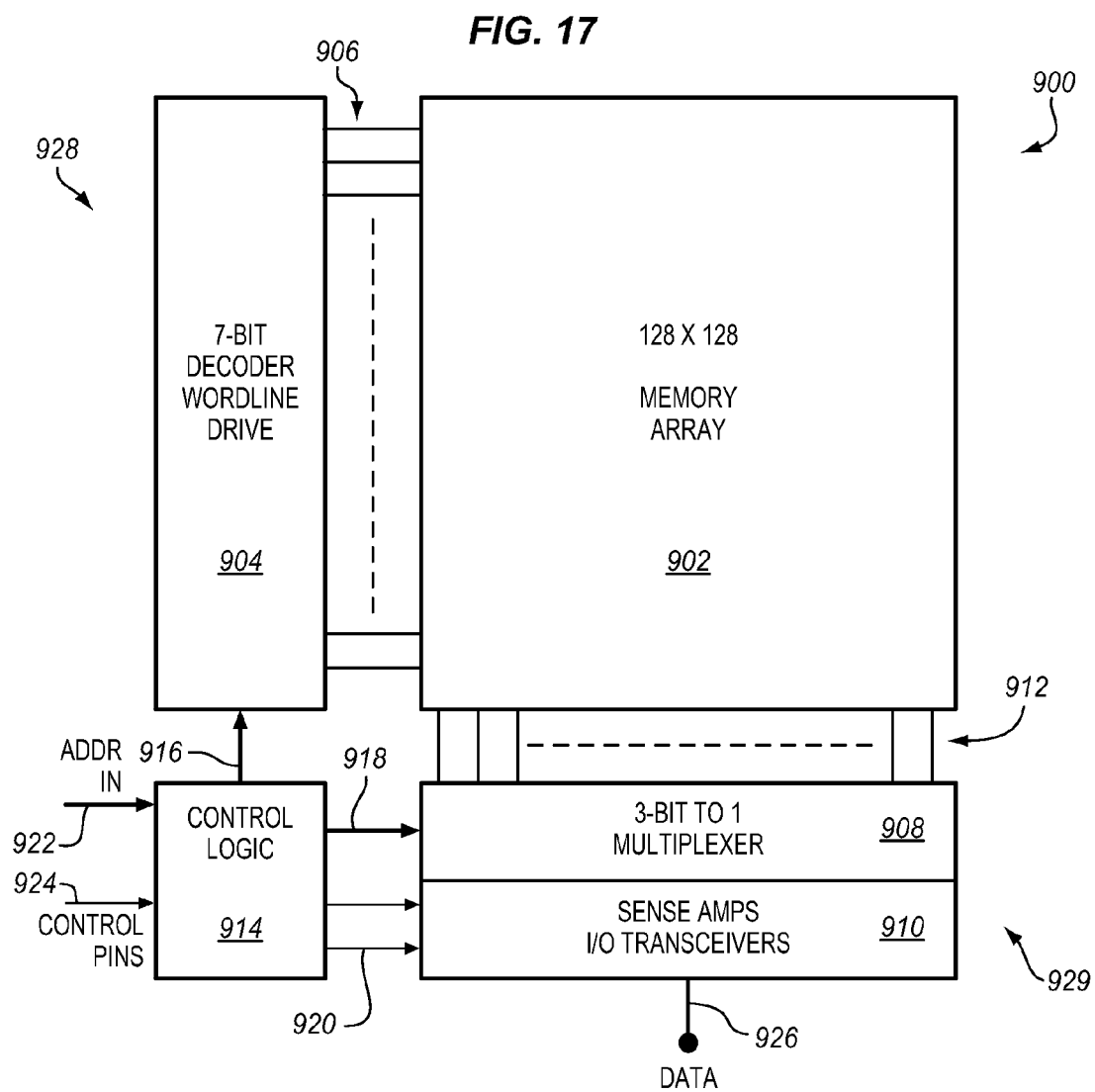
FIG. 17 illustrates an exemplary memory utilizing any of the memory cells disclosed herein.

FIG. 17 is a block diagram of a memory circuit 900 including an exemplary variable resistance memory array 902 according to the principles of the present invention connected to write and read circuitry. The memory cells in variable resistance memory array 902 may be any of the memory cells described above. In one embodiment, variable resistance memory array 902 is formed of 128×128 memory cells. However, electronic variable resistance memory array 902 may have virtually any size as understood in the art. Variable resistance memory array 902 may be connected to a 7-bit decoder word line drive circuit 904 via word lines 906. Variable resistance memory array 902 may be further coupled to a 3-to-1 bit multiplexer 908 and sense amplifiers/input-output transistors 910 via bit lines 912. Control logic circuitry 914 may be in communication with (i) the decoder 904 via control lines 916, (ii) multiplexer 908 via control lines 918, and (iii) sense amplifier 910 via control lines 920. External input lines may include an address input line 922 and control lines 924. A data output line 926 may be used to output data from memory circuit 900 via sense amplifiers/transceivers 910.

In operation, an external processor may be used to drive the control logic 914. Control logic circuitry 914 communicates with decoder 904, multiplexer 908, and sense amplifiers 910, which, in combination, are used to write data into variable resistance memory array 902 and read data stored in memory array 902. Control logic 914 and decoder 904 comprise a write circuit 928 for placing the resistive switching memory cell in a first resistive state or a second resistive state depending on information input into the memory; and control logic 914, multiplexer 908, and sense amps 910 comprise a read circuit 929 for sensing the state of the memory cell and providing an electrical signal corresponding to the sensed state of the memory cell. As known in the art, the first resistance state may correspond to a logic "0" state, and the second resistance state may correspond to a logic "1" state, or vice versa. Herein, for convenience, we have referred to the first resistance state as the ON or low resistance state and the second resistance state as the OFF or high resistance state.

All of the above cells are written to by applying either a set or reset voltage between the bottom and top electrodes, or in the case of the device of FIG. 16, across the electrodes 682 and 686, or in the case of the device 530 of FIG. 12, between the upper electrode 560 and one or more of the source 542, the drain 544, and the semiconductor 534. The devices having a VRM stack located over a channel are read by controlling the conductivity of the channel with the state of the VRM material. For example, in the cell 370 of FIG. 6, if a read voltage is applied to the upper electrode 383, the voltage on the lower electrode 381 will be higher if VRM 382 is conducting and lower if VRM 382 is high resistive. This difference in voltage on bottom electrode 381 will result in a different conductivity of channel 378, which can be read by applying a voltage across source 377 and drain 376 and reading either a voltage or a current. The CEM switching cell 440 of FIG. 10 can be read similarly to a ferroelectric or DRAM memory, using the select transistor 454 to select the cell to be read or written. A voltage or current is placed across the cells, and the resistance state of the CEM determines the voltage or charge developed across the cell and by sense amplifiers 910. It is evident that, if the CEM is conductive, the voltage drop across the CEM will be much smaller than the voltage drop when the CEM is insulating. It is evident that this read can be described in terms of reading a resistance, a voltage, or a current. That is, referring to FIG. 1, if a read voltage of, say about 0.3 volts, is placed across the cell, there will be a large resistance, voltage, or current difference between a cell that is in the state represented by curve 47 and a cell that is in the state represented by the curve 44. In any description, it is evident that the read is inherently non-destructive because the read voltage is well below $V_{RESET}$ and $V_{SET}$.

The variable resistance—diode configuration, such as shown in FIG. 3, and the variable resistance—JFET configuration, such as shown in FIG. 7, provide important advantages for memory operation. In the variable resistor-diode architecture, the one-way current flow action of the diode introduces an asymmetry in the I-V hysteresis. Under reverse bias, the diode only allows a small reverse saturation current, in approximately the uAmp range, to flow. The current flow is small and almost all voltage potential drops across the diode, so there is no switching of the variable resistance. Hence, the reverse bias hysteresis traces are flat. Under forward bias conditions, the diode starts to flow current at the diode turn on voltage. Above the turn on voltage, the diode is behaving more or less as a short; thus, switching of the variable resistance takes place normally. The main result in the hysteresis curves under forward bias is that they are offset by the built-in potential of the diode. The importance of this configuration is that one can now switch the variable resistance element normally under forward bias for writing the memory state. One can also apply reverse bias and not worry about disturbing the memory state. This reverse bias condition is useful to perform a non-destructive read out (NDRO). This is done by measuring the depletion capacitance of the reverse-biased diode. Before getting to the NDRO of the variable resistance-diode architecture, it is helpful to review the capacitance-voltage characteristics of a stand alone diode first. Under reverse bias conditions, there is a layer at the interface of the pn junction that is depleted of free carriers. This is called the depletion layer. The depletion layer gets wider under larger biasing, while it gets thinner under smaller biasing. The depletion layer can be considered as a parallel plate capacitor with the width of the depletion layer being the spacing between the plates. Hence, the capacitance of the diode will be smaller at large reverse bias and larger at small reverse bias. This capacitance can be measured by superimposing a high frequency AC signal on top of the static reverse bias voltage. Now consider the variable resistor in series with the diode. When the variable resistor is in the ON (low resistance) state, there is not much effect to the C-V curves, as the variable resistance only introduces a small series resistance. However, when the variable resistance is in the OFF (high resistance) state, there is a significant series resistance and capacitance. These series components reduce the overall measured depletion layer capacitance. In this way, the resistance state of the variable resistance element can be determined from the measured capacitance without disturbing the memory state. This read process is very different from the usual read process for memories because a capacitance is measured rather than a voltage or current. The JFET memory can also be read in the usual fashion by reading the voltage, current, or resistance of the channel.

Write operation of the VRM-JFET, such as shown in FIG. 7, is similar to the write operation of the VRM-diode. The gate is forward biased with respect to the drain (or source) line. The gate stack of the VRM-JFET has the same architecture and equivalent circuit as the VRM-diode configuration. Unlike a MOSFET, where the gate oxide prevents any current flow, the gate of the JFET can be forward biased to flow current for writing the resistive state.

For the read operation, the depletion region created by the JFET gate stack is directly responsible for modulating the conductivity between the source and drain. As gate reverse bias is increased, the depletion region extends into the channel region and reduces the source-drain conductivity. In the limiting case, the channel becomes completely "pinched off" and the JFET is OFF. In a sense, the CeRAM-JFET is similar to a Flash structure. Flash is a single transistor that uses a gate stack that is able to store a static charge, which thereby modifies the channel conductance. The CeRAM-JFET is also a single transistor that uses a variable resistor in the gate stack as a programmable voltage divider. By turning the variable resistor off, part of the gate bias is dropped on the variable resistor, which reduces the bias level applied to the JFET gate. This in turn increases the source-drain conductivity. The major difference between the Flash and CeRAM-JFET devices is that the control charge on the Flash gate is static, while the voltage dividing behavior of the CeRAM-JFET is dynamic and determined by the RC constant of the gate stack. Read operation of the CeRAM-JFET is thereby accomplished through the transient response of voltage pulses. A pulse is applied simultaneously to the gate and the source. These pulses need to be in opposite polarities to keep the gate reverse biased. The measured voltage on the drain line yields the memory state of the variable resistor. For the variable resistor ON state, the entire gate pulse is dropped on the JFET gate and the JFET channel is pinched off. This results in a lower channel conductivity and a lower voltage on the drain line. For the variable resistance OFF state, only part of the gate bias pulse is dropped on the JFET gate. The resulting source-drain conductance is higher, and a larger drain voltage is measured.

With proper design, the MOSFET with a VRM on the gate device 430 shown in FIG. 9 may be used in place of the JFET-VRM scheme described above. While, as mentioned above, the MOSFET gate oxide 435 prevents DC current flow through the VRM 437, the RC characteristic of the VRM/MOS gate stack 434 allows for a transient current/voltage response that is sufficient to switch the VRM during pulsing. By proper scaling of the VRM and gate oxide thickness and area, the MOS capacitance and the VRM resistance can be engineered to permit a write function that switches the VRM material 437. Thus, writing to the VRM is accomplished even though no direct current can flow through the gate stack. Readout of the MOSFET-VRM circuit is performed by the same method as the JFET-VRM read function described above.

Those skilled in the art will recognize that, in the memory structures above which utilize n and/or p doping, the n and p dopings can be interchanged. As disclosed above, the preferred variable resistance material integrated into circuit memory structures of FIGS. 3-17 is a CEM material. Since a CEM material is "born" in the conducting state, no high voltage or high current is required to activate it. Further, the CEM materials have very large voltage and current differences between the ON state and OFF state; thus, they lend themselves to the non-disturb read operations discussed above. However, it is also evident that, once the advantages of the memory architectures have been described as they have been herein, these architectures can also be used with any other variable resistance material (VRM) in which the resistance is sufficiently stable for a memory. These variable resistance materials have been summarized in the Background of the Invention above, so there is no need to repeat this summary again.

Figure 18:
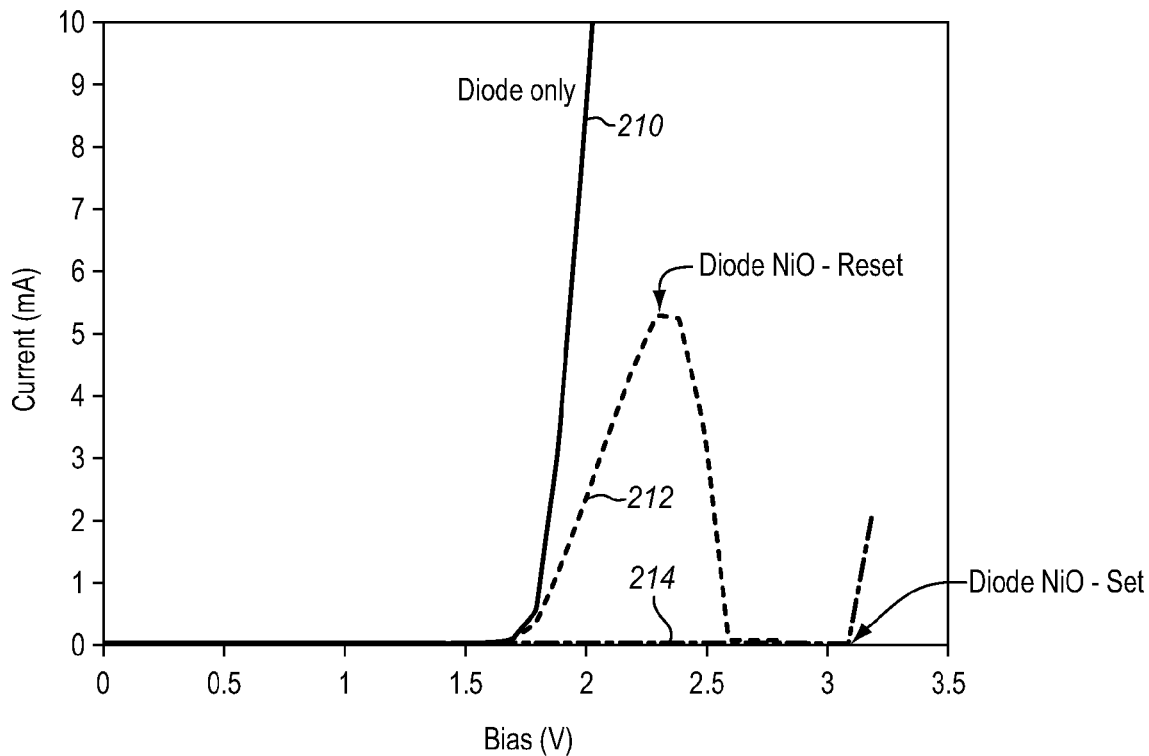
FIG. 18 is a graph comparing the voltage versus current curves for the diode portion of FIG. 3 and the SET and RESET functions of the switching cell of FIG. 3 with nickel oxide as the VRM.

FIG. 18 is a graph comparing the voltage versus current curves for the diode portion of FIG. 3 and the SET and RESET functions of the M/VRM/M-diode switching cell 330 of FIG. 3 with nickel oxide as the VRM. The diode curve is at 210, the ON curve which leads into the RESET function is at 212, and the OFF curve that leads into the SET function is at 214. As known in the art, when the diode is forward biased, the device does not conduct until a threshold is reached, and then the current rises exponentially. With the VRM device formed over the diode, the current is essentially zero up to the threshold voltage, due to the action of the diode, then rises, but not quite so quickly, due to the resistance of the VRM layer. The threshold voltage is about 1.7 for this diode. At about 2.3 volts, the current begins to drop and becomes essentially zero at about 2.6 volts, as the resistance has greatly increased. Then, at about 3.1 volts, the current again increases, indicating the VRM material has switched back to a low resistance state. If the voltage is lowered, the current will follow the ON curve. A feature of M/VRM/M-diode device 330 is that resistive switching occurs only when the diode is forward biased. Reverse bias prohibits switching. This is a significant improvement over the prior art, as this feature prevents disturb in a cross-tie memory.

Figure 19:
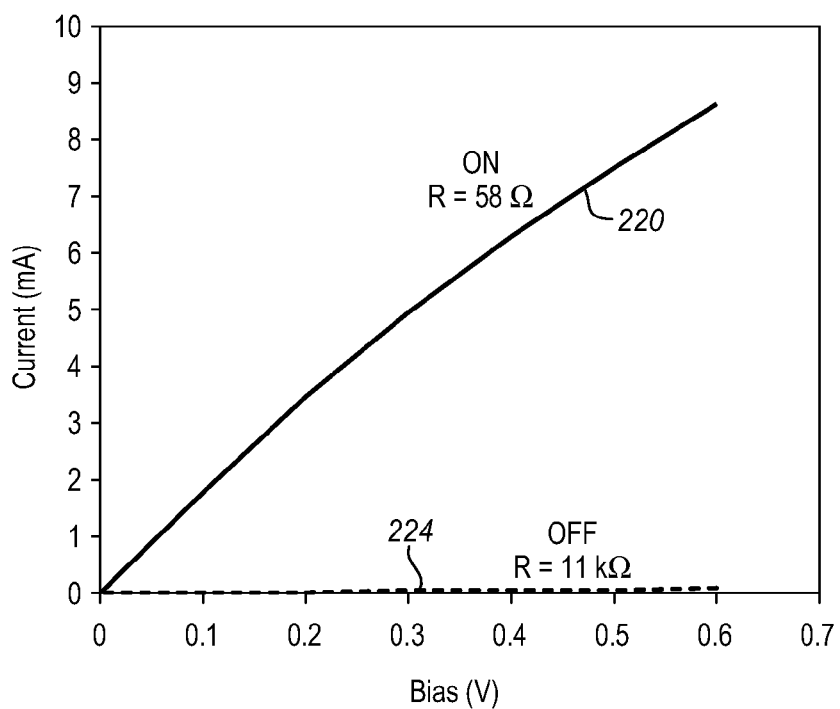
FIG. 19 is a graph comparing the voltage versus current in the OFF and ON states for the switching cell of FIG. 3.
Figure 20:
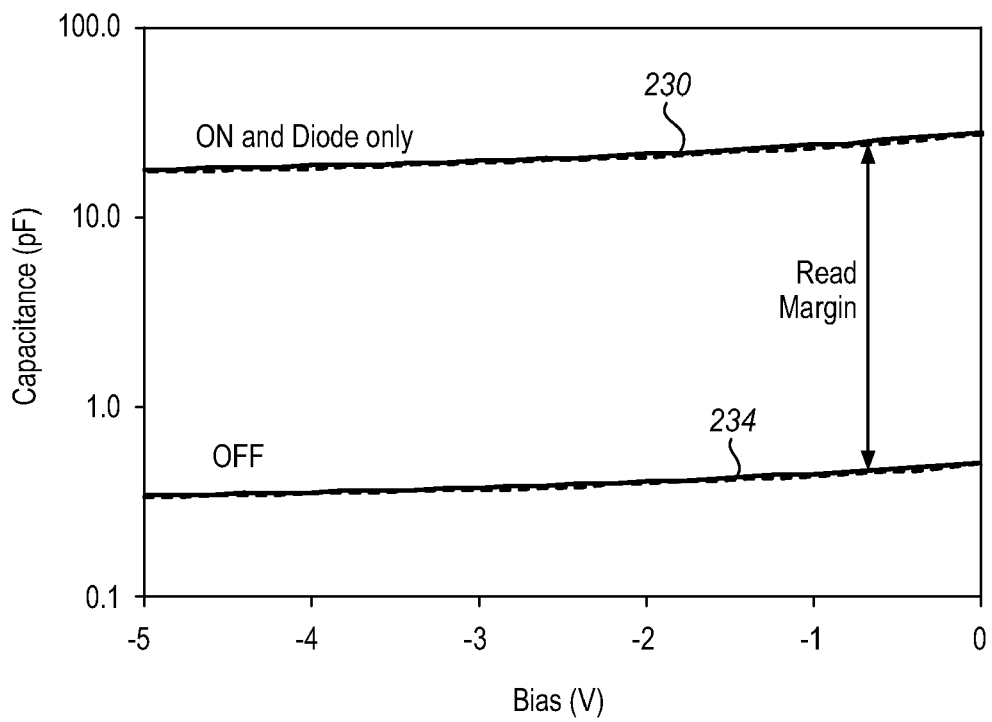
FIG. 20 is a graph comparing the capacitance versus voltage for the diode only portion of the structure of FIG. 3 and the M/VRM/M-diode switching cell of FIG. 3 with a nickel oxide VRM.
Figure 21:
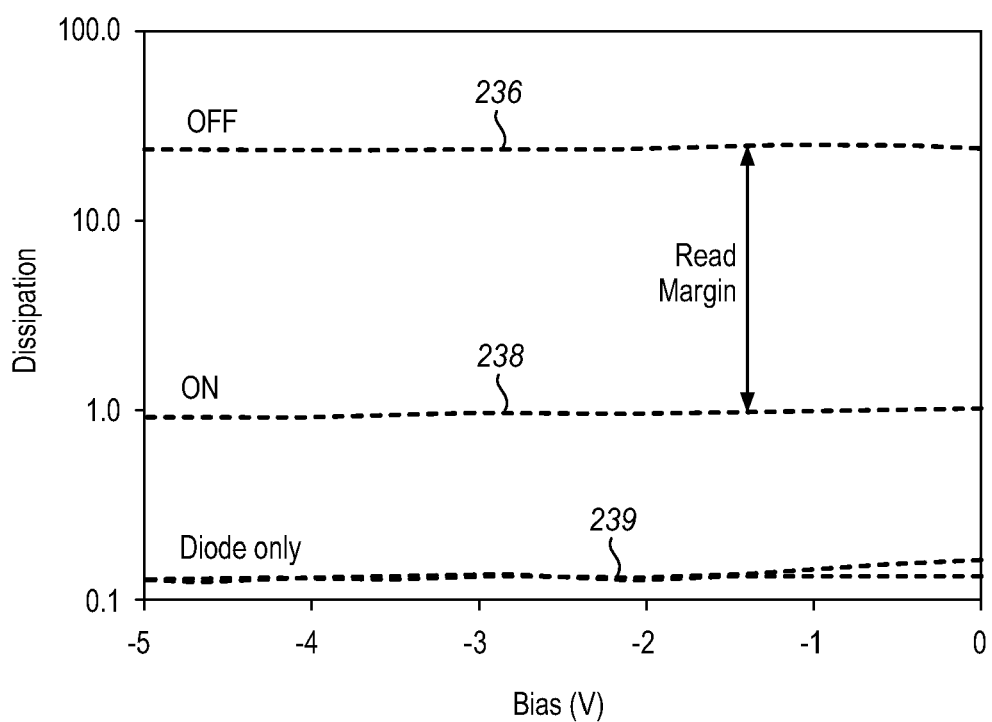
FIG. 21 is a graph comparing the dissipation versus voltage curves for the ON and OFF states of the switching cell of FIG. 3 and the diode only structure.

FIG. 19 is a graph comparing the voltage versus current in the OFF and ON states for the M/VRM/M-diode switching cell of FIG. 3 with a nickel oxide—carbon VRM. FIG. 20 compares the capacitance versus voltage curves for the ON and OFF states and for the diode only, and FIG. 21 compares the dissipation versus voltage for the ON and OFF states. As can be seen from FIG. 19, the resistivity in the OFF state is 11 kOhms, while it is only 58 ohms in the ON state. As a result, the current in the ON state can easily be differentiated from that in the OFF state, with just a small applied voltage, such as 0.5 volts. Thus, the memory window is very large. From FIG. 20, the read margin is over 300 picofarads. In the ON or low resistance state, the voltage is primarily dropped across the reverse bias diode. This is a depletion capacitance state. The capacitance as shown in FIG. 20 and the dissipation as shown in FIG. 21 are similar to the same quantities in the diode only. In the OFF or high resistance state, the voltage is partially dropped across the VRM resistor, and the dissipation increases according to $\tan(d)=\omega RC$. Because the state of the switch or memory can be read with a voltage much lower than the RESET or SET voltage, and unless the RESET of SET voltage is reached, the system always remains in the same state; the M/VRM/M-diode switching cell permits the fabrication of a no-disturb, non-destructive readout memory.

Figure 22:
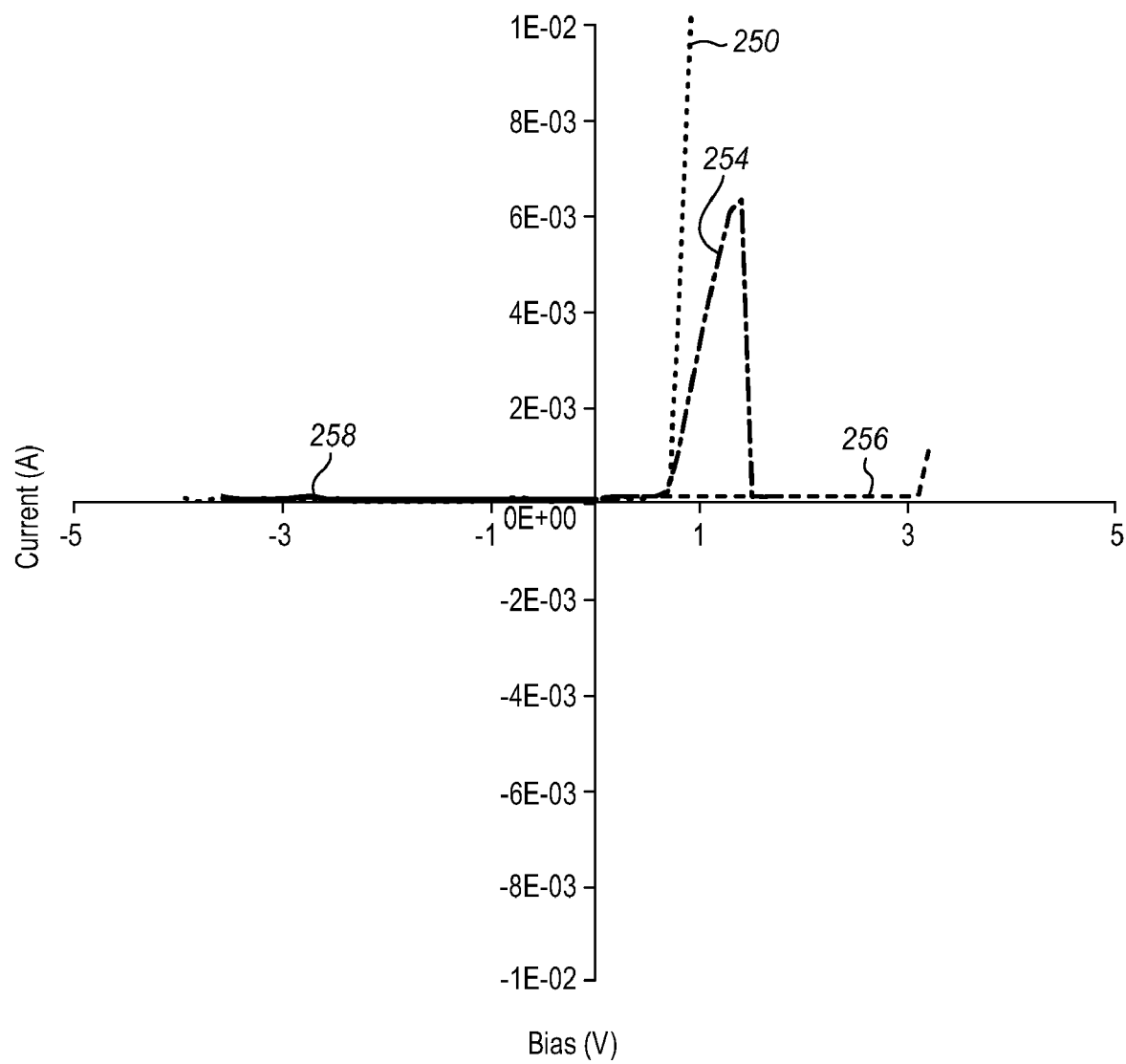
FIG. 22 is a graph comparing the voltage versus current curves for the JFET only portion of the structure of FIG. 7 with the SET and RESET functions of the switching cell of FIG. 7 with nickel oxide as the VRM.

FIG. 22 is a graph comparing the voltage versus current curves for the JFET SET and RESET functions of the M/VRM/M-JFET switching cell 400 of FIG. 7 with nickel oxide as the VRM, and also comparing these curves for the voltage versus current curve of the JFET. The well-known JFET curve is at 250, the ON curve leading to the RESET function is at 254, and the OFF curve leading to the SET function is at 256. As can be seen from the figure, no switching is possible when the JFET gate/drain junction is reverse biased. With forward bias, the device does not conduct until a threshold is reached, and then the current rises exponentially. With the VRM device formed over the diode, the current is essentially zero up to the threshold voltage, due to the action of the diode, then rises, but not quite so quickly, due to the resistance of the VRM layer. The threshold voltage is about 0.8 volts for this diode. At about 1.4 volts, the current begins to drop and becomes essentially zero at about 1.6 volts, as the resistance has greatly increased. Then, at about 3.1 volts, the current again increases, indicating the VRM material has switched back to a low resistance state. If the voltage is lowered, the current will follow the ON curve. A feature of M/VRM/M-JFET device 400 is that resistive switching occurs only when the JFET is forward biased. Reverse bias prohibits switching. This is a significant improvement over the prior art, as this feature prevents disturb in a cross-tie memory.

Figure 23:
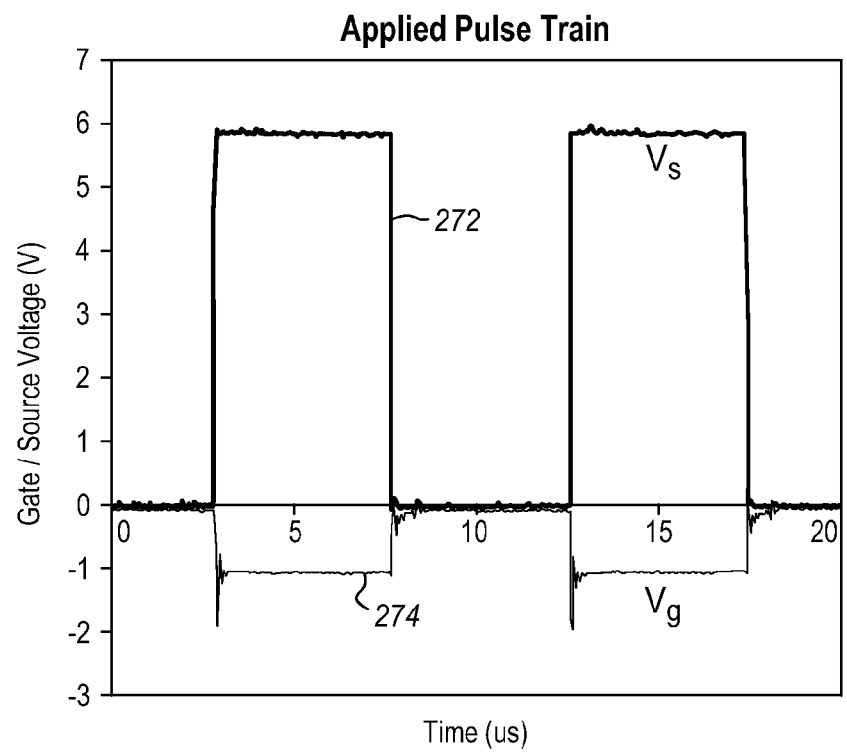
FIG. 23 is a graph showing time versus voltage for voltage pulses applied to the gate and source of the switching cell of FIG. 7 with nickel oxide as the VRM.
Figure 24:
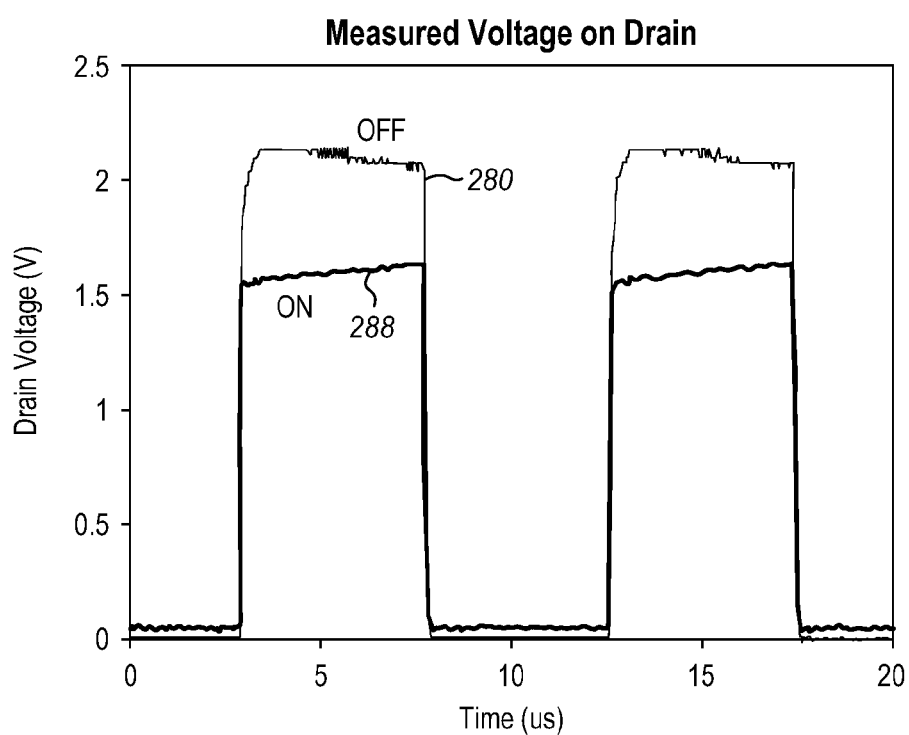
FIG. 24 is a graph showing the measured voltage on the drain of the switching cell of FIG. 7 in response to the voltage pulses applied as show in FIG. 23.

FIG. 23 is a graph showing time versus voltage for voltage pulses applied to the gate and source of the switching cell 400 of FIG. 7 with nickel oxide as the VRM, and FIG. 24 is a graph showing the measured voltage on the drain of the switching cell 400 of FIG. 7 in response to the voltage pulses applied as shown in FIG. 23. In FIG. 23, the gate voltage is the approximately negative one-volt curve 274 and the source voltage is the approximately six-volt curve 272. Since the gate voltage puts a reverse bias on the M/VRM/M stack 404, no switching occurs. When the VRM layer is ON, essentially no gate voltage is dropped on the VRM resistor; thus, the gate bias is the applied bias of about negative one volt. When the VRM resist is OFF, significant gate voltage drops across the VRM layer; thus, the gate sees less bias voltage. Therefore, the gate voltage, when the VRM switch is ON, is larger than the gate voltage when the VRM switch is OFF; and in the ON state, the JFET channel will be small, i.e., closer to pinch-off, thus, the measured drain voltage is lower at 288 for the ON state than at 280 for the ON state. Thus, the state of the switching VRM element 404 effectively controls drain voltage by modulation of the JFET transconductance. The difference between the drain voltages is more than half a volt and, thus, is easily measured. Therefore, the M/VRM/M-JFET 400 of FIG. 7 provides for a no-disturb non-destructive memory readout when the source and gate of the device is pulsed.

Figure 25A:
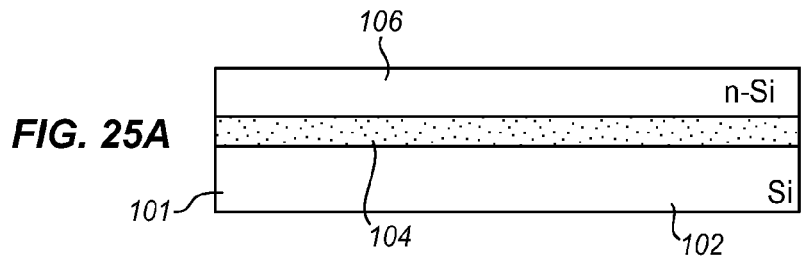
FIGS. 25A through 25E show various stages in an exemplary manufacturing process according to the invention for an M/VRM/M-MESFET switching cell according to the invention.
Figure 25B:
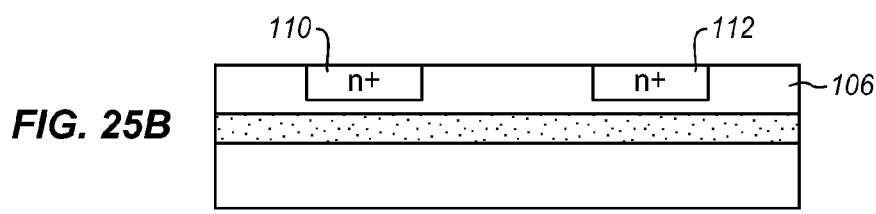
Figure 25C:
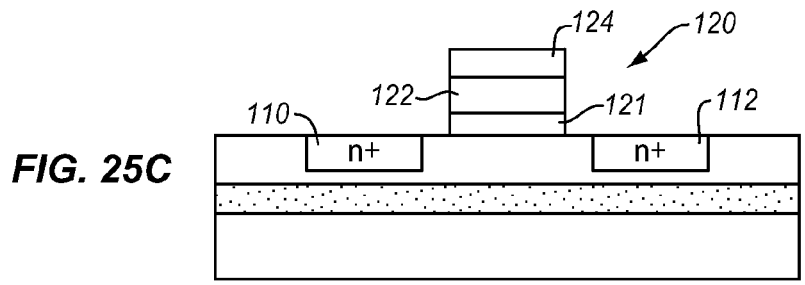
Figure 25D:
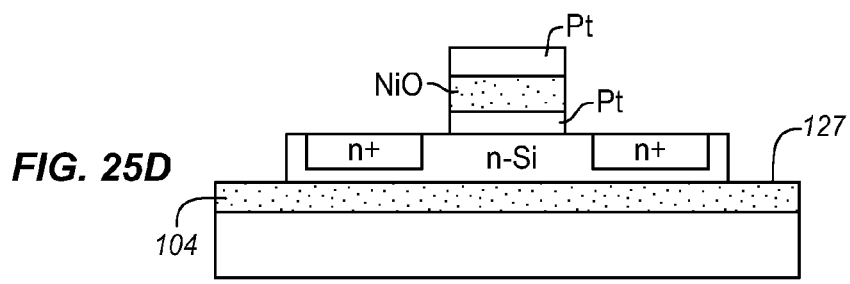
Figure 25E:
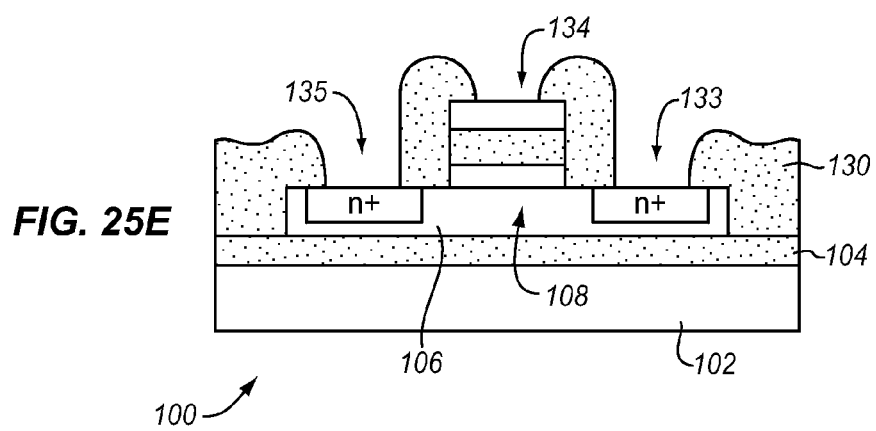

FIGS. 25A through 25E show various stages in a manufacturing process according to the invention for a M/VRM/M-MESFET switching cell 100, which is the cell of FIG. 3, except that it is shown formed on an SOI (silicon on insulator) structure 101. As shown in FIG. 25A, M/VRM/M-MESFET SOI structure 101 comprises a silicon wafer 102 on which is formed an insulator 104, preferably silicon dioxide, on which is formed a silicon layer 106, preferably n-type silicon. Then, as shown in FIG. 25B, n+ active areas 110 and 112 are formed in layer 106, preferably by implantation. Then, as shown in FIG. 25C, M/VRM/M gate stack 120 is formed by depositing bottom electrode 121, preferably platinum, VRM layer 122, preferably $NiO(C_x)$, and top electrode 124, preferably platinum. The gate stack 120 is patterned, the $NiO(C_x)$ is annealed, and silicide is deposited on active areas 110 and 112 and top electrode 124. Next, as shown in FIG. 25D, the silicon is etched at 127 to the buried oxide, and then, as shown in FIG. 25E, an isolation layer 130, preferably of silicon dioxide, is deposited, and contact holes 133, 134, and 135 are opened, preferably by etching. Then the integrated circuit is completed by forming interconnects and backend processing. Except for the $NiO(C_x)$ formation, the processing above is standard CMOS processing. Thus, the architectures and processing of the invention are easily integrated into a CMOS fabrication plant. As known in the art, many other steps and additional layers may be used.

Figure 26A:
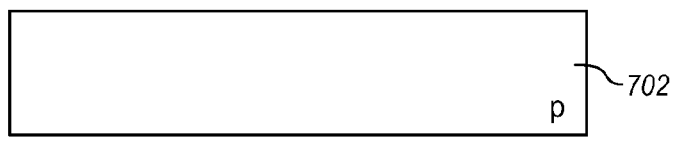
FIGS. 26A through 26H show various stages in an exemplary manufacturing process according to the invention for the M/VRM/M-JFET switching cell of FIG. 7.
Figure 26B:
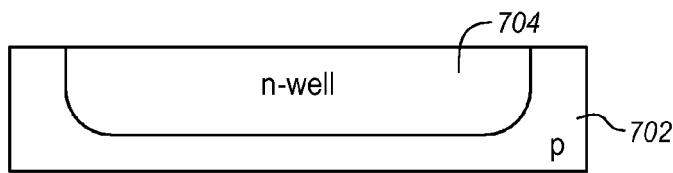
Figure 26C:
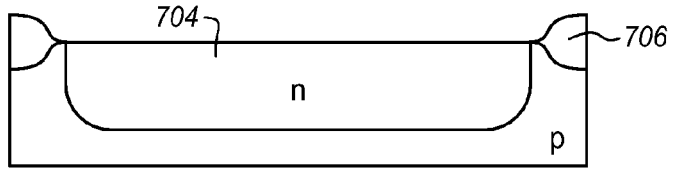
Figure 26D:
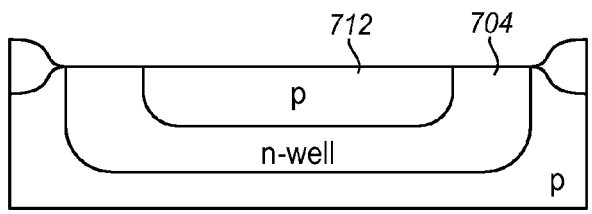
Figure 26E:
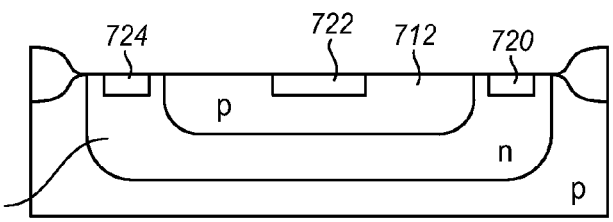
Figure 26F:
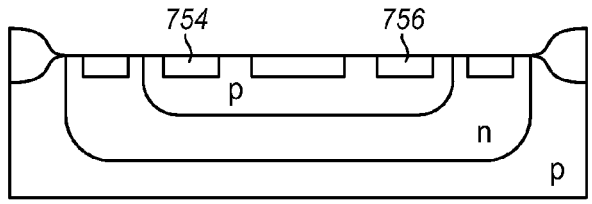
Figure 26G:
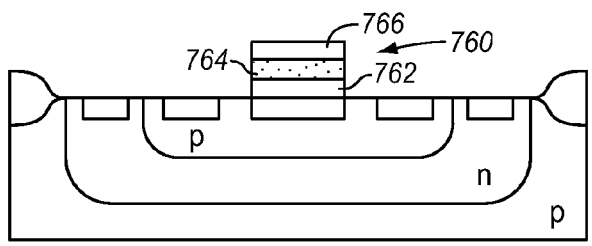
Figure 26H:
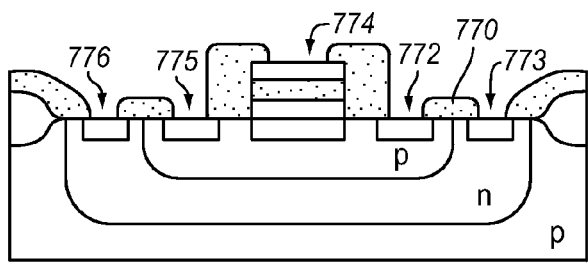

FIGS. 26A through 26H show various stages in a manufacturing process according to the invention for the M/VRM/M-JFET switching cell 400 of FIG. 7. The cell 400 is preferably formed on a p-type silicon wafer base 702, which forms an isolation layer. In FIG. 26B, an n-type well 704 has been formed in wafer 702. Then, in FIG. 26C, isolation areas 706 are formed using a LOCOS subprocess. The foregoing are all basic CMOS subprocesses. The remainder of the subprocesses differ slightly from the CMOS subprocess, though each subprocess has a counterpart in the conventional CMOS process. In FIG. 26D, a p-type channel 712 has been formed with a p+ implant. In the corresponding CMOS method, this implant would create the p-channel stop. In the CMOS process, the gate oxidation and polysilicon gates are then formed. These processes are not required in the JFET process. In FIG. 26E, an n+ process implant is used to form the back contact active areas 720 and 724 and the gate 722. In the corresponding CMOS process, this implant would form the NMOS source/drain in structures where a PMOS back contact is used. Then, as shown in FIG. 26F, a p+ implant forms the p+ source/drains 754 and 756 in the JFET structure. The known corresponding CMOS step is the p+ implant that forms the PMOS source drains in structures where an NMOS back contact is used. Next, as shown in FIG. 26G, the VRM stack 760 comprising a bottom electrode 762, VRM layer 764, and top electrode 766 is formed followed by a VRM, preferably $NiO(C_x)$, anneal, silicidation, and etching to pattern the M/VRM/M stack. In the corresponding CMOS process, there is the formation of the capacitor and electrodes similar to the well-known ferroelectric or DRAM stack process and the formation of conventional CMOS process (or ferroelectric process) platinum/silicide contacts. Then, as shown in FIG. 26H, a passivation layer 770 is formed, followed by the etching of contact holes 772, 773, 774, 775, and 776. In the corresponding CMOS process, the field oxide passivation process is performed, followed by contact holes. Then, in both processes, the integrated circuit is completed with the formation of the interconnects and the backend processes. As can be seen from the above comparison of the JFET process with the CMOS process, a few steps of the CMOS process are skipped, and a few additional steps of VRM stack formation are added; otherwise, the process of the invention comprises essentially the standard CMOS process steps, though used to form a different structure. This means that the process and structures of the invention can transparently be integrated into standard CMOS manufacturing plants.

Figure 27A:
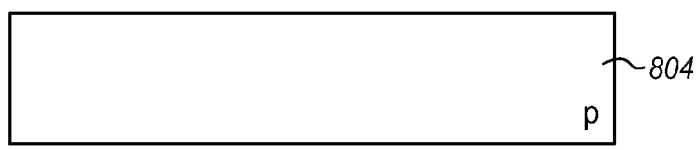
FIGS. 27A through 27F illustrate an exemplary process according to the invention for forming an M/VRM/M n-p junction diode switching cell of FIG. 3.
Figure 27B:
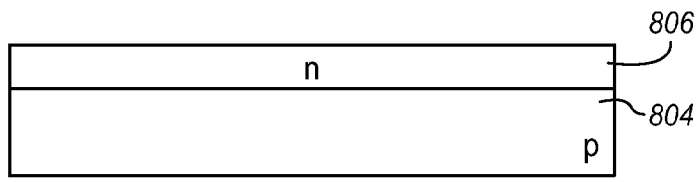
Figure 27C:
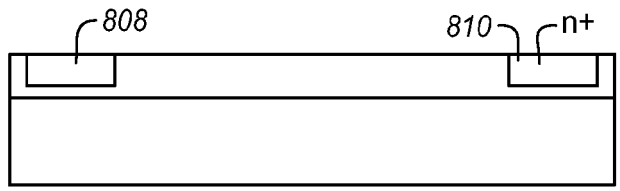
Figure 27D:
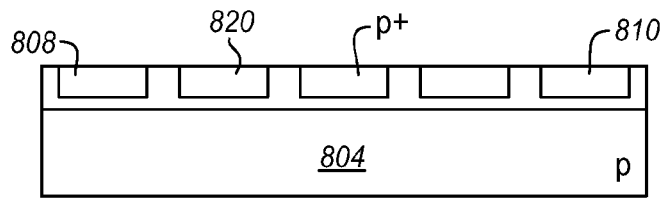
Figure 27E:
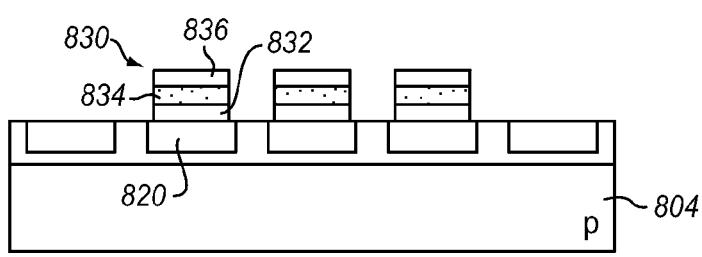
Figure 27F:
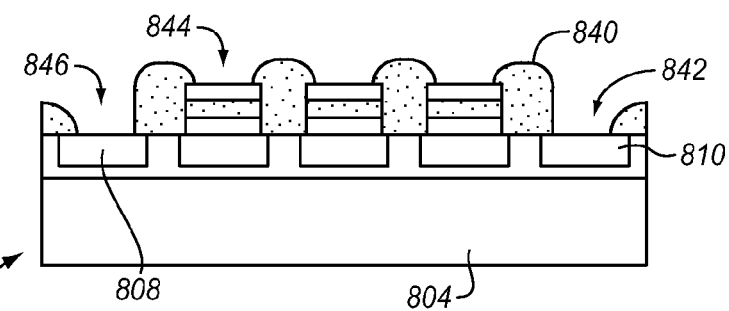

Turning now to FIGS. 27A through 27F, a preferred embodiment of a process according to the invention for forming an M/VRM/M n-p junction diode switching cell 330 of FIG. 3 is shown. In the embodiment shown, the process starts with a p-type wafer 804 as shown in FIG. 27A. Then, as shown in FIG. 27B, an n implant is performed to form an n-type layer 806, which eventually will form the bit lines. Then, as shown in FIG. 27C, an n+ implant is performed to form the bit line contacts 808 and 810. Next, a p+ implant is performed, as shown in FIG. 27D, to form the pn junctions. Following, a number of M/VRM/M stacks, such as 830, are formed by depositing the bottom electrode layer 832, the VRM layer 834, and the top electrode 836, preferably, platinum, $NiO(C_x)$ and platinum, respectively, as shown in FIG. 27E. Then follows the NiO anneal and the silicidation anneal. As in the other processes, the standard passivation layer 840 deposition and etching of contact holes, such as 842, 844, and 846, then is performed as shown in FIG. 27F. Finally, the M/VRM/M n-p junction diode is completed by the formation of interconnects and the backend processes known in the art. As suggested above, this structure is preferably implemented in a cross-tie type structure on top of the semiconductor wafer.

Figure 28A:
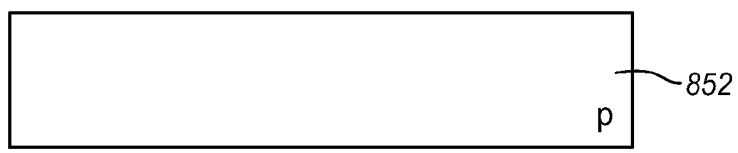
FIGS. 28A through 28F show various stages in an exemplary manufacturing process according to the invention for the M/VRM/M-metal/semiconductor or Schottky diode switching cell of FIG. 5.
Figure 28B:
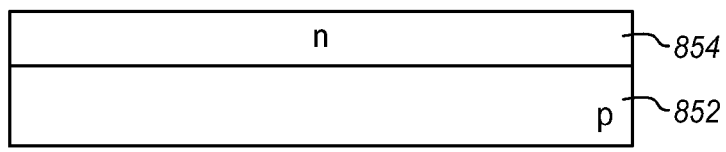
Figure 28C:
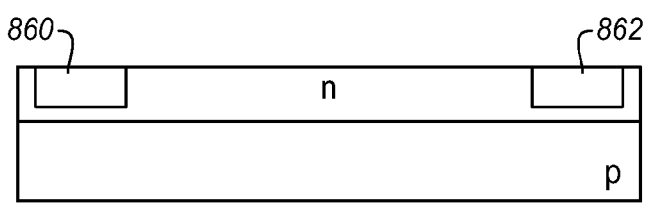
Figure 28D:
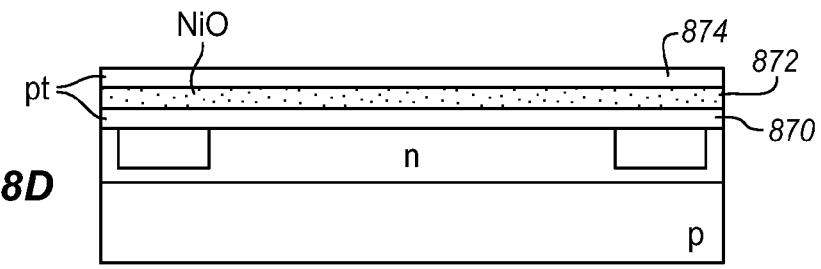
Figure 28E:
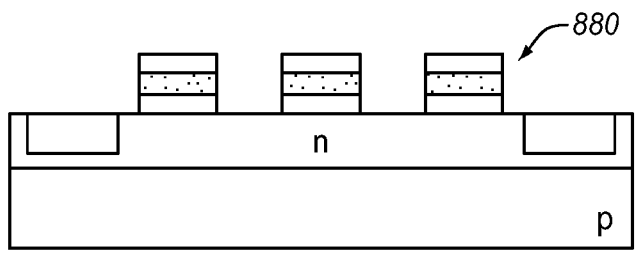
Figure 28F:
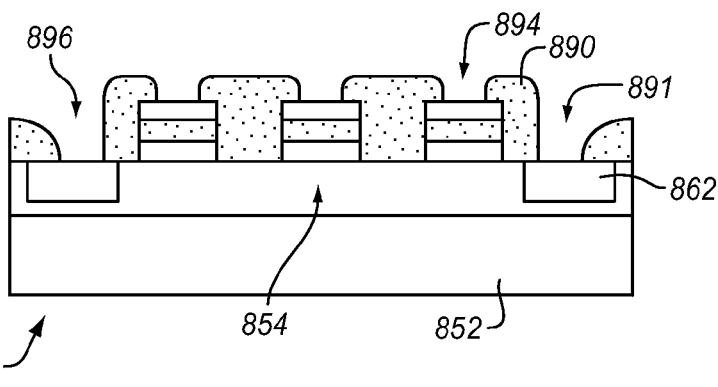

FIGS. 28A through 28F show various stages in a manufacturing process according to the invention for the M/VRM/M-metal/semiconductor or Schottky diode switching cell 350 of FIG. 5. In the embodiment shown, cell 350 is built on a p-type wafer or isolation layer 852, as shown in FIG. 28A. As before, an n implant forms an n-type layer 854 from which the bit lines will be formed, as shown in FIG. 28B. Then, as indicated in FIG. 28C, an n+ implant forms the bit line contacts 860 and 862. Then follows the VRM device layers, 870, 872, and 874, preferably platinum, $NiO(C_x)$ and platinum, respectively, as shown in FIG. 28D. The $NiO(C_x)$ is annealed, followed by a platinum-silicide anneal. The metal/VRM/metal stacks, such as 880, are then formed by a patterning etch, as indicated in FIG. 28E. Then, again, there follows the deposition of the insulating passivation layer 890, and the etching to form contact holes, such as 891, 894, and 896. Finally, the integrated circuit including cells 350 is completed by depositing the interconnects and performing the backend process. Again, this is essentially a cross-tie structure formed on a silicon wafer.

Four exemplary processes for manufacture of VRM integrated circuits according to the invention have been shown above. Having disclosed these examples, and recognizing the disclosure of the similarities of the processes of the invention to conventional CMOS and ferroelectric integrated circuit fabrication processes, those skilled in the art will be able to apply the tremendous volume of CMOS and ferroelectric literature to the VRM devices. For example, though platinum electrodes have been given as examples, those skilled in the art will recognize that such electrodes are preferably formed with a thin adhesive layer of titanium, and that the entire literature of oxide structures on platinum/titanium electrodes and the top electrode literature involving platinum, titanium, tungsten, and other materials can be applied. Any place a semiconductor is mentioned, those skilled in the art will recognize that gallium arsenide, germanium, germanium/silicon, and other semiconductor technologies can be substituted. As mentioned above, the term "metal" or "M" is used herein to indicate any suitable conductor, including metals such as platinum and tungsten, or polysilicon, or other conventional conductors known in the art. Similarly, much other CMOS and ferroelectric technology is translatable into the VRM devices and processes.

Since a VRM retains the resistance state it is placed in indefinitely with no voltage or electric field applied to it, all of the VRM devices described herein are inherently non-volatile switching devices. As known in the art, non-volatile switching devices can be used as or in non-volatile memories. Thus, all of the devices described above also comprise a non-volatile memory cell, or cells in the case of the structures, such as those of FIGS. 13, 14, 15, 7, 27F, and 28F which show multiple VRM elements. Thus, it should be understood that whether the device has been referred to as a switch, a switching cell, a memory cell, or a memory in the above discussion has been determined by the context, and in all cases the other terms apply also.

The particular systems, memory designs, and methods described herein are intended to illustrate the functionality and versatility of the invention, but the invention should not be construed to be limited to those particular embodiments. It is evident that those skilled in the art may make numerous uses and modifications of the specific embodiments described, or equivalent structures and processes may be substituted for the structures and processed described. For example, the memory is shown with the variable resistance elements and their associated transistors arranged in columns. The VRM elements may just as well have been arranged in rows. Thus, herein, the arrangement is referred to as a row/column arrangement. Further, while in some instances the preferred type of semiconductor wafer has been specified, it should be understood that in any of the devices described, any semiconductor can be used. Further, in many instances, even though the specific type of semiconductor has been specified, e.g., n-type, p-type, n+, p+, etc., those skilled in the art will recognize that other types may be used. For example, most devices work essentially the same if n-type is replaced with p-type and p-type replaced with n-type. As another example, though platinum electrodes have been given as examples, those skilled in the art will recognize that such electrodes are preferably formed with a thin adhesive layer of titanium, and that the entire literature of oxide structures on platinum/titanium electrodes and the top electrode literature involving platinum, titanium, tungsten, aluminum, copper, and other materials can be applied. Moreover, any of the layers may be formed of multiple sublayers. For example, it is conventional in the art to form a conductive layer out of several sublayers, each layer being a different conductor, such as polysilicon formed on a silicide. Similarly, an insulating layer may be formed out of several different sublayers, each comprising a different insulator. Any place a semiconductor is mentioned, those skilled in the art will recognize that gallium arsenide, germanium, germanium/silicon, and other semiconductor technologies can be substituted. As mentioned above, the term "metal" or "M" is used herein to indicate any suitable conductor, including metals such as platinum and tungsten, or polysilicon, or other conventional conductors known in the art. Since certain changes may be made in the above systems and methods without departing from the scope of the invention, it is intended that all subject matter contained in the above description or shown in the accompanying drawings may be interpreted as illustrative and not in a limiting sense; consequently, the invention is to be construed as embracing each and every novel feature and novel combination of features present or inherently possessed by the systems, devices, and methods described in the claims below and their equivalents.

What is claimed as new and desired to be protected by Letters Patent of the United States is:

1. A resistive switching memory comprising:
   a plurality of memory cells arranged in rows and columns, each said memory cell being a resistive switching memory cell including a resistive switching material, and each of said memory cells comprising a conductor/variable resistance material/conductor (M/VRM/M) stack formed on a channel in a semiconductor;
   a write circuit for placing selected ones of said resistive switching memory cells in a first memory cell resistive state or a second memory cell resistive state depending on information input into said memory, wherein the resistance of said material is higher in said second resistance state than in said first resistance state; and
   a read circuit for sensing the state of said memory cell and providing an electrical signal corresponding to the sensed state of said memory cell.

2. A memory as in claim 1 wherein each of said cells comprises a field effect transistor (FET).

3. A memory as in claim 2 wherein each of said cells comprises a JFET.

4. A memory as in claim 1 wherein said VRM comprises a correlated electron material (CEM).

5. A method of operating an integrated circuit memory, said method comprising:
   providing a memory cell including a semiconductor having a first active area, a second active area, and a channel between said active areas; and
   controlling the conductance of said channel using a variable resistance material.

6. A method as in claim 5 wherein said controlling comprises controlling a voltage across said channel or a current in said channel using said variable resistance material.

7. A method as in claim 5, and further comprising reading a voltage across said channel, a current in said channel, or a resistance in said channel.

8. A method of reading a non-volatile, variable resistance memory cell, said method comprising:
   measuring the capacitance of said memory cell; and
   determining the state of said memory cell using said measured capacitance.

9. A method as in claim 8 wherein said memory cell comprises a diode in series with said VRM, and said measuring comprises measuring the capacitance of said diode in series with said VRM.

* * * * *